(12) United States Patent
Scholz et al.

(10) Patent No.: US 7,804,925 B2
(45) Date of Patent: Sep. 28, 2010

(54) DETECTION ARRANGEMENT, COUNTER UNIT, PHASE LOCKED LOOP, DETECTION METHOD AND METHOD FOR GENERATING AN OSCILLATOR SIGNAL

(75) Inventors: Markus Scholz, München (DE); Christian Münker, München (DE)

(73) Assignee: Infineon Technologies AG, Munich (DE)

( * ) Notice: Subject to any disclaimer, the term of this patent is extended or adjusted under 35 U.S.C. 154(b) by 884 days.

(21) Appl. No.: 11/705,924

(22) Filed: Feb. 14, 2007

(65) Prior Publication Data
US 2008/0191921 A1 Aug. 14, 2008

(51) Int. Cl.
*H04L 7/00* (2006.01)
*H04L 25/00* (2006.01)
*H04L 25/40* (2006.01)

(52) U.S. Cl. .................. 375/371; 375/376; 327/156; 327/158; 327/159

(58) Field of Classification Search .......... 375/371, 375/374, 376; 327/141, 147, 149–151, 156, 327/158–162
See application file for complete search history.

(56) References Cited

U.S. PATENT DOCUMENTS

| | | | | |
|---|---|---|---|---|
| 6,377,100 | B1* | 4/2002 | Fujieda | 327/262 |
| 6,621,352 | B2* | 9/2003 | Matsumoto et al. | 331/1 A |
| 7,023,195 | B2* | 4/2006 | Rosenbaum et al. | 324/76.53 |
| 7,034,589 | B2* | 4/2006 | Chao | 327/158 |
| 7,188,267 | B2* | 3/2007 | Harima | 713/400 |
| 7,279,946 | B2* | 10/2007 | Minzoni | 327/158 |
| 2008/0143405 | A1* | 6/2008 | Bhullar et al. | 327/158 |

OTHER PUBLICATIONS

"A Jitter Characterization System Using a Component-Invariant Vernier Delay Line", Antonio H. Chan and Gordon W. Roberts, IEEE Transactions on Very Large Scale Integration (VLSI) Systems, vol. 12, No. 1, Jan., 2004, pp. 79-95.

"A Time-to-Digital-Converter-Based CMOS Smart Temperature Sensor", Poki Chen, Chun-Chi Chen, Chin-Chung Tsai and Wen-Fu Lu, ieee Jounral of Solid-State Circuits, vol. 40, No. 8, Aug. 2005, pp. 1642-1648.

"A Zero Dead-Time, High Temporal Resolution, Time-of-Flight Particle Detector IC", Piotr Dudek and John V. Hatfield, University of Manchester Institute of Science and Technology, Department of Electrical Engineering and Electronics, Proceedings of Eurosensors XI Conference, Warsaw, Poland, Sep. 1997, pp. 1341-1344.

(Continued)

*Primary Examiner*—Jean B Corrielus
(74) *Attorney, Agent, or Firm*—Eschweiler & Associates, LLC

(57) ABSTRACT

A detection arrangement includes a counter unit which receives a first clock signal and a reference clock signal. The counter unit derives a first data word as a function of a time deviation between clock edges of the first clock signal and the reference clock signal. The detection arrangement further includes a signal processing unit to determine a phase deviation word as a function of the first data word and a second data word, the second data word based on the duration of a clock period of the reference clock signal.

47 Claims, 16 Drawing Sheets

OTHER PUBLICATIONS

"A High-Resolution CMOS Time-to-Digital Converter Utilizing a Vernier Delay Line", Piotr Dudek, Stanislaw Szezepanski and John V. Hatfield, IEEE Transactions on Solid-State Circuits, vol. 35, No. 2, Feb. 2000, pp. 240-247.

"A High-Precision Time-to-Digital Converter Using a Two-Level Conversion Scheme", Chorng-Sii Hwang, Poki Chen and Hen-Wai Tsao, IEEE Transactions on Nuclear Science, vol. 51, No. 4, Aug. 2004, pp. 1349-1352.

"Review of Methods for Time Interval Measurements with Picosecond Resolution", Józef Kalisz, Institute of Physics Publishing, Military University of Technology, 2004, pp. 17-32.

"A 900-Mb/s CMOS Data Recovery DLL Using Half-Frequency Clock", Xavier Maillard and Maarten Kuijk, IEEE Journal of Solid-State Circuits, vol. 37, No. 6, Jun. 2002, pp. 711-715.

"An Integrated CMOS High Precision Time-to-Digital Converter Based on Stabilised Three-Stage Delay Line Interpolation", Antti Mäntyneimi, Faculty of Technology, Department of Electrical and Information Engineering, Infotech Oulu, University of Oulu, 2004, 80 Pgs.

"A High Resolution Time to Digital Converter", Users Manual, Manuel Mota, LIP-Lisboa, ECP/MIC—CERN—Geneva (mota@sunvlsi,cern.ch), Jan. 29, 1999, pp. 1-29.

"An Integrated Time-to-Digital Converter with 30-ps Single-Shot Precision", Elvi Räisänen-Ruotsalainen, Timo Rahkonen and Juha Kostamovaara, IEEE Journal of Solid-State Circuits, vol. 35, No. 10, Oct. 2000, pp. 1507-1510.

"All Digital TX Frequency Synthesizer and Discrete-Time Receiver for Bluetooth Radio in 130-nm CMOS", Robert Bogdan Staszewski, Khurram Muhammad, Dirk Leipold, Chih-Ming Hung, Yo-Chuol Ho, John L. Wallberg, Chan Fernando, Ken Maggio, Roman Staszewski, Tom Jung, Jinseok Koh, Soji John, Irene Yuanying Deng, Vivek Sarda, Oscar Moreira-Tamayo, Valerian Mayega, Ran Katz, Ofer Friedman, Oren Eytan Eliezer, Elida Deobaldia and Poras T. Balsara, IEEE Journal of Solid-State Circuits, vol. 39, No. 12, Dec. 2004, pp. 2278-2291.

* cited by examiner

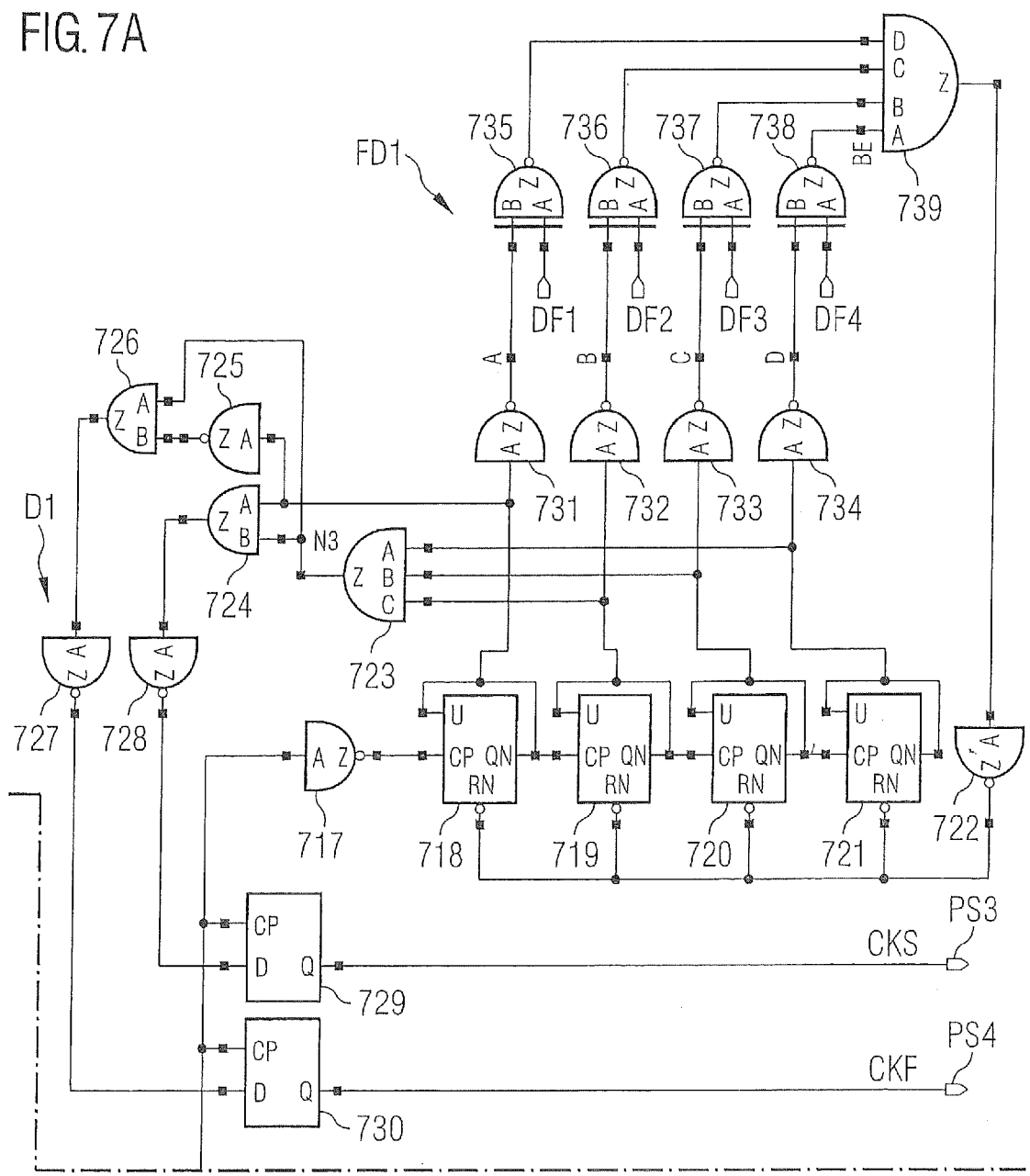

DETECTION ARRANGEMENT, COUNTER UNIT, PHASE LOCKED LOOP, DETECTION METHOD AND METHOD FOR GENERATING AN OSCILLATOR SIGNAL

BACKGROUND OF THE INVENTION

In today's wireless radio systems, different mobile radio standards such as Global System for Mobile Communication (GSM), Enhanced Data Rates for GSM Evolution (EDGE) and Universal Mobile Telecommunications Standard (UMTS) are used. Data transmission in these and other systems is performed using radio frequency signals.

For generating, transmitting, or receiving of radio frequency signals, nowadays digitally controlled oscillators (DCOs) are used. A DCO generates a radio frequency signal depending on a digital frequency word. Realized in a semiconductor device, a digitally controlled phase locked loop (PLL) with a DCO uses less space than a respective PLL with an analog voltage controlled oscillator (VCO).

An oscillator signal which is generated by the DCO is provided directly or through a frequency divider to a second input of a phase and/or frequency detector which also receives a reference clock signal at a first input. The phase and/or frequency detector determines a digital error word which is, for example, provided to the DCO through a digital loop filter.

The detector, which can also be called a time to digital converter (TDC), usually measures a time difference between clock edges of the fed back oscillator signal and the reference clock signal. The accuracy of the measurement depends on the quality of the components used and external parameters such as temperature, for example. Accordingly, the TDC can comprise a delay locked loop (DLL) which is formed with analog components for the time measurement. A time resolution of a DLL is limited depending on technology caused switching times of the analog components. Furthermore, a conventional DLL uses non-negligible space on a semiconductor device, especially when providing a control unit to compensate for process, temperature and voltage variations.

In some conventional TDCs an array of DLLs is used to improve the time resolution, wherein the space needed on a semiconductor device increases quadratically with the desired resolution.

BRIEF DESCRIPTION OF THE DRAWINGS

The invention is explained in detail below using exemplary embodiments with reference to the drawings in which.

DETAILED DESCRIPTION OF THE INVENTION

Figure 1:
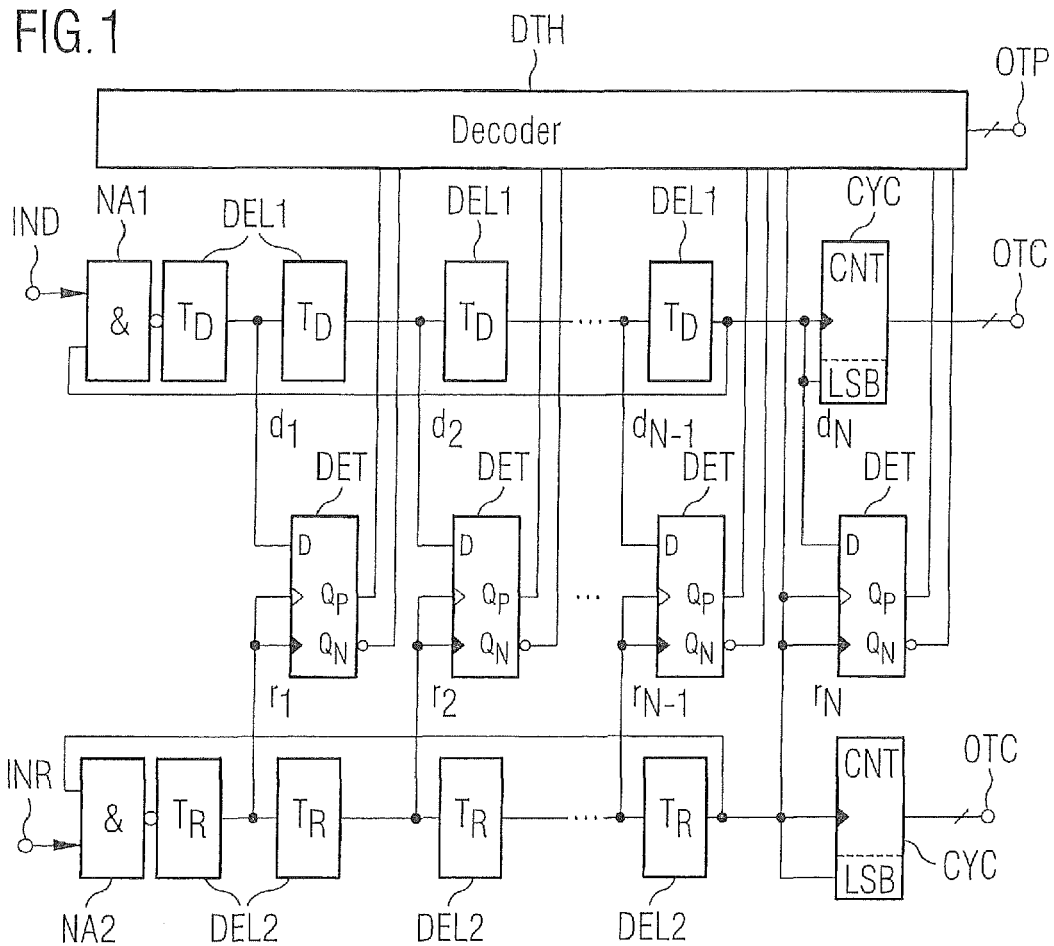
FIG. 1 is an embodiment of a counter unit.

In the following description further aspects and embodiments of the present invention are disclosed. In addition, reference is made to the accompanying drawings, which form a part thereof, and in which is shown by way of illustration, in which the invention may be practiced. The embodiments herein provide a better understanding of one or more aspects of the present invention. This disclosure of the invention is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows an embodiment of a counter unit with a first input IND to receive a first clock signal and a second input INR to receive a reference clock signal. The counter unit comprises a first delay ring having a plurality of delay elements DEL1 and a NAND-gate NA1 with a first input coupled to the clock input IND and a second input coupled to an output of the last delay element DEL1. Accordingly, the counter unit comprises a second delay ring having a plurality of delay elements DEL2 and a NAND-gate NA2 coupled to the second clock input INR and to an output of the last delay element DEL2. The number N of delay elements DELL of the first delay ring and the number N of delay elements DEL2 of the second delay ring correspond to each other. Each of the delay elements DEL1 of the first delay ring comprises a first delay time $T_D$, whereas the delay elements DEL2 of the second delay ring comprise a second delay time $T_R$ which is different from the first delay time $T_D$.

In one embodiment the counter unit further comprises a number N of detection elements DET corresponding to the number N of delay elements DELL or DEL2, respectively.

Each of the detection elements DET comprises an input D coupled to an output of a respective one of the delay elements DELL of the first delay ring. Accordingly, each detection element DET comprises clock inputs for positive and negative clock edges which are coupled to an output of a corresponding respective delay element DEL2 of the second delay ring. As well, an inverting and a non-inverting output of the detection elements DET are coupled to a decoder unit DTH.

In one embodiment the counter unit comprises a first and a second cycle counter CYC which are each coupled to a respective output of the last, that means rightmost delay element DEL1, DEL2 on their input sides. The cycle counters CYC comprise outputs OTC to provide a cycle word. Accordingly, the decoder unit DTH comprises an output OTP to provide a position word. Therefore a counter output is formed by the outputs OTC, OTP.

In one embodiment the delay elements DEL1, DEL2 of the first and the second delay ring form respective delay pairs. In one embodiment, the delay elements DEL1, DEL2 comprise inverter elements having different switching times $T_D$, $T_R$. In this case, the inverter elements of the first and the second delay ring form respective inverter pairs.

The counter unit shown in FIG. 1 can be utilized to measure a time deviation between a clock edge of the first clock signal at the first clock input IND and a clock edge of the reference clock signal at the second clock input INR. In one embodiment, with the delay times $T_D$, $T_R$ being different, the measurement is performed using the Vernier principle.

The time for one measurement corresponds to the number of delay elements passed through by the clock edges multiplied by the longer delay time of the delay times $T_D$, $T_R$.

Each of the delay rings delays the respective clock edge of the clock signals at the clock inputs IND, INR through the respective delay elements DEL1, DEL2. The respective leftmost delay element of the delay rings comprise a first and a second input formed by the NAND-gates NA1, NA2, the first and the second input coupled to the output of the rightmost delay element and to the clock inputs IND, INR, respectively.

In one embodiment the N delayed signals $d_1, r_1, d_2, r_2, d_{N-1}, r_{N-1}, d_N, r_N$ are provided to the detection elements DET to detect a coincidence of clock edges at the respective outputs. In case of a coincidence detection, the clock edge of the faster delay ring, having the shorter delay time, has reached the clock edge of the slower delay ring, having the longer delay time. The information of the coincidence detection is provided to the decoder unit DTH which generates the position word corresponding to the position or number of the delay element or detection element where the coincidence occurred. For example, the first delay ring is a fast delay ring and the second delay ring is a slow delay ring, such that the clock edge of the clock signal to be compared reaches the clock edge of the reference clock signal.

Furthermore, the cycle counters CYC count the number of cycles that the clock edges have performed within the delay rings, and generate the cycle word corresponding to that number of cycles.

A total number of delay elements which are passed through by the clock edges of the first clock signal and the reference clock signal can be determined as a function of the position word, the cycle word, and the number of N of delay elements in a delay ring or detection elements, respectively. A time deviation corresponds to the determined total number and a delay difference $\Delta T$ between the first and the second delay time $T_D$, $T_R$. Accordingly, the time resolution of the counter unit corresponds to $\Delta T$ and is not limited to a delay time of a delay element, for example in a conventional arrangement.

In one embodiment, the decoder unit DTH comprises a thermometer decoder configured to generate the binary position word as a function of thermometer coded position information provided by the detection element DET. The decoder unit can be provided in one embodiment as an integrated circuit with logical gates or, as a non-limiting alternative example, as a function in a digital microprocessor.

In another embodiment, the inputs of the cycle counters CYC are coupled to the outputs of another pair of delay elements DEL1, DEL2 instead of the rightmost delay pair. In this case, it may be necessary to provide a correction value for the cycle words corresponding to the position of a coincidence detection and the position of the delay pair connected to the cycle counters CYC.

In one embodiment the clock signals are processed before providing them to the clock inputs IND, INR, for example by providing a single clock edge of each clock signal, respectively, until a coincidence of clock edges has been detected at one of the detection elements.

In another embodiment the cycle counters CYC are omitted from the counter unit. In this embodiment the numerical range of time deviations that can be measured is reduced, but the time deviation can be determined with less effort. In other words, the time deviation is determined solely depending on the position word instead of being dependent on the position word and the cycle word when using the cycle counters CYC.

Figure 2:
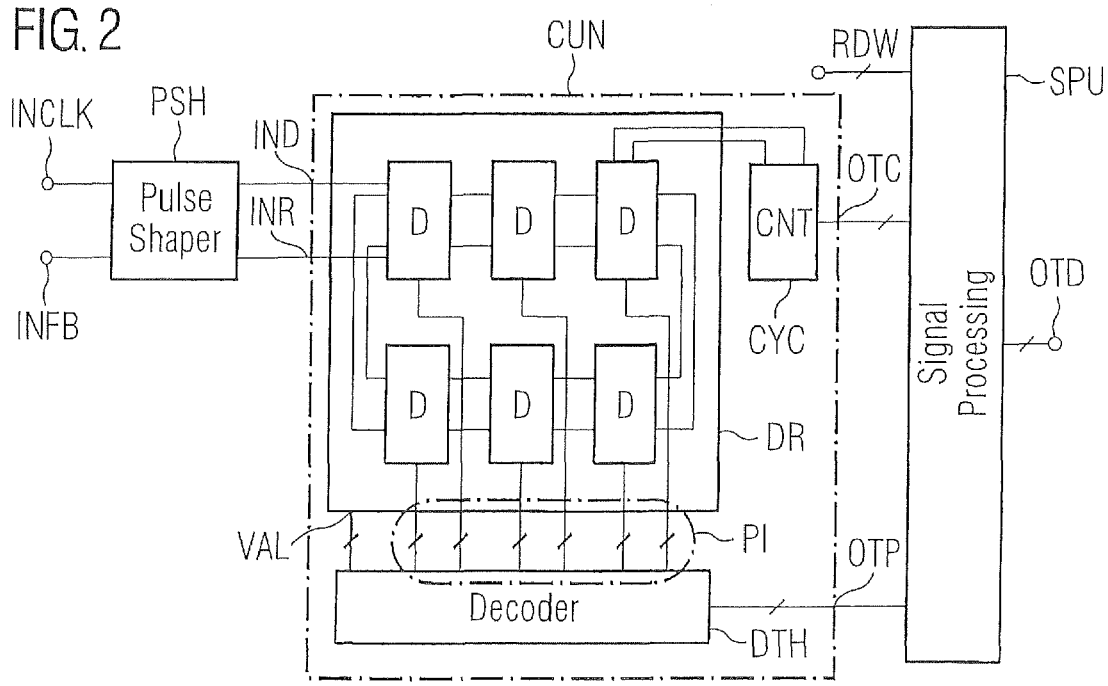
FIG. 2 is a first embodiment of a detection arrangement.

FIG. 2 shows an embodiment of a detection arrangement comprising a pulse shaper PSH, a counter unit CUN and a signal processing unit SPU. The pulse shaper PSH is coupled between the first and the second clock input IND, INR of the counter unit CUN and the first input INCLK to receive, for example, a reference clock signal and a second input INFB to receive a clock signal to be compared with the reference clock signal, for example a feedback signal in a PLL. Similar to the embodiment shown in FIG. 1, the counter unit CUN comprises a dual delay ring or oscillator ring DR having delay and detection blocks (D) which are coupled to a cycle counter CYC and to the decoder unit DTH for providing a position information PI.

Each of the delay and detection blocks comprises a number of delay pairs or inverter pairs and a corresponding number of detection elements to detect a coincidence of clock edges at the respective pairs. When providing inverter pairs for the delay and detection blocks, it is useful to provide an odd number of inverter pairs and detection elements as a total number N within the dual oscillator ring DR. The counter unit CUN can provide a first data word comprising the position word and the cycle word at the outputs OTP, OTC to the signal processing unit SPU.

The signal processing unit SPU comprises a further input to receive a second data word or reference data word RDW which depends on a duration of a clock period of the reference clock signal at the input INCLK. For example, the second data word RDW corresponds to a number of delay elements passed through in a counter unit CUN by two succeeding clock edges of the reference clock signal until the second clock edge of the reference clock signal in a faster delay ring has reached the first clock edge in a slower delay ring.

In one embodiment, the delay times for determining the second data word RDW correspond to the delay times of the dual delay ring DR. The second data word RDW can be measured or determined analytically in one embodiment, for example.

The first data word of the counter unit CUN represents a phase deviation between the clock signals at the inputs IND, INR or INCLK, INFB, respectively. Accordingly, the second data word RDW represents a duration of a clock period of the reference clock signal. The signal processing unit SPU relates the first and second data word to each other by normalizing the phase deviation represented by the first data word with the reference clock period length represented by the second data word RDW. The result of this operation is a normalized phase deviation word which is independent of technology, temperature, supply voltages and other varying external parameters with respect to a comparable determination of the first and the second data word. The phase deviation word is provided at the phase deviation output OTD.

In one embodiment, the phase deviation word is processed in the SPU by providing an offset value to the phase deviation word or scaling the phase deviation word or clipping the phase deviation word before providing it at the output OTD. Also a combination of the above mentioned processing operations is possible. As the cycle counter CYC is coupled to a delay detection block apart from the clock inputs IND, INR, it may be necessary in one embodiment that either the cycle counter CYC or the signal processing unit SPU perform a correction of the cycle word corresponding to the position of the coincidence detection within the delay rings.

The dual delay ring DR can have a further output VAL coupled to the decoder unit DTH to provide additional information about the detection of a clock edge coincidence which can be used to determine whether the position word can be forwarded to the signal processing unit SPU.

Figure 3:
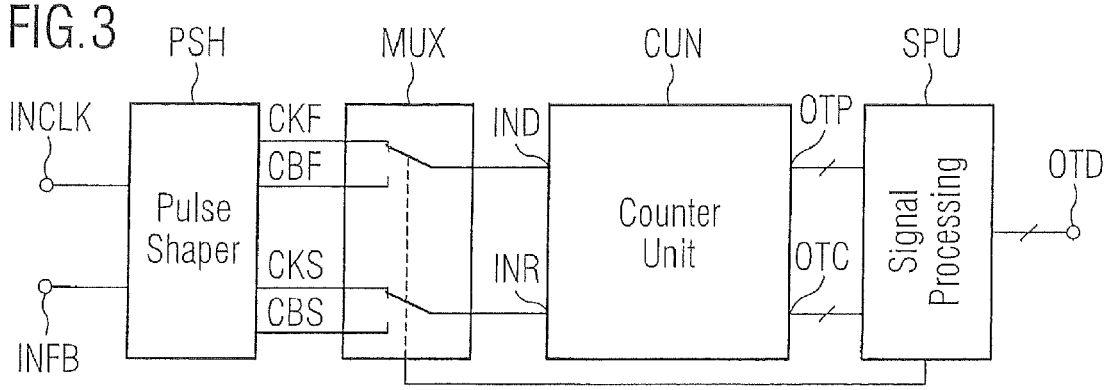
FIG. 3 is a second embodiment of a detection arrangement.

FIG. 3 shows another embodiment of a detection arrangement. It comprises a pulse shaper PSH which on its input side is coupled to a first input INCLK to receive a reference clock signal and a second input INFB to receive a clock signal to be compared. The pulse shaper generates different auxiliary clock signals CKF, CBF, CKS, CBS, wherein, for example, the auxiliary clock signals CKF and CKS correspond to delayed versions of the reference clock signal and the auxiliary clock signals CDF, CDS correspond to the first clock signal to be compared and to the reference clock signal.

A multiplexer MUX which can be controlled by the signal processing unit SPU provides either the reference clock signals CKF, CKS or the clock signals CBF, CBS to the counter unit CUN.

In this case the duration of the clock period of the reference clock signal and a time deviation between a first clock signal and the reference clock signal can be determined sequentially. For example, the embodiment of FIG. 1 can be used for the counter unit CUN.

A signal processing unit receives a first and a second data word sequentially and may store the second data word RDW for calculating or determining the phase deviation word at the output OTD. In one embodiment, the determination of the clock period duration and the determination of the time deviation between the first clock signal and the reference clock signal can be alternated after each single determination step. In another embodiment, a second data word is determined only at specific instants, for example at a startup of the detection arrangement or periodically after a predetermined period of time during operation of the detection arrangement, whereas the first data word is determined almost continually. It may also be desirable to perform a measurement of the clock period duration of the reference clock signal when external parameters such as temperature, supply voltage or others change, resulting in an adapted second data word RDW.

As both the first and the second data word are determined under the same influence of the above-mentioned external parameters, absolute variations can be compensated for by normalizing the phase deviation with respect to the measured duration of the reference clock period.

The multiplexer MUX makes it possible that the counter unit CUN can be operated in a first or in a second mode of operation, wherein in the first mode operation, the first data word is derived as a function of a time deviation between clock edges of the first clock signal and the reference clock signal, and wherein in the second mode of operation, the second data word is derived as a function of clock edges of the reference clock signal.

Figure 4:
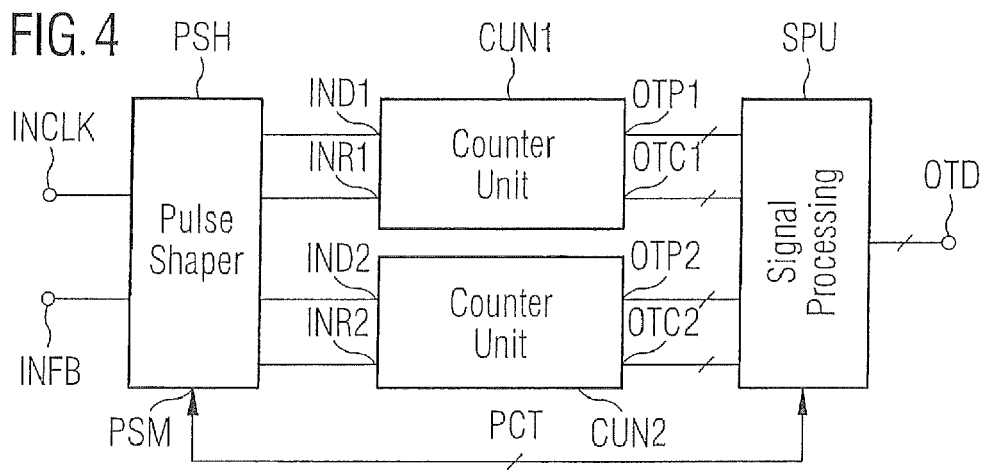
FIG. 4 is a third embodiment of a detection arrangement.

FIG. 4 shows another embodiment of a detection arrangement which comprises a pulse shaper PSH, a first and a second counter unit CUN1, CUN2, and a signal processing unit SPU. Similar to the embodiment shown in FIG. 3, the pulse shaper PSH generates auxiliary clock signals CKF, CKS for determining the duration of a reference clock period in one of the counter units CUN1, CUN2 and auxiliary signals CBF, CBS for determining a time deviation between clock edges of the first clock signal and the reference clock signal in the respective other one of the counter units CUN1, CUN2. To this end, the counter units CUN1, CUN2 each comprise clock inputs IND1, INR1 and IND2, INR2 respectively, to receive the auxiliary clock signals. The counter units CUN1, CUN2 further comprise respective outputs OTP1, OTP2 to provide the respective position words and outputs OTC1, OTC2 to provide respective cycle words. In one embodiment it is desirable that both the first and the second counter units CUN1, CUN2 comprise similar technology parameters, especially corresponding first and second delay times $T_D$, $T_R$.

In this embodiment, the determination of the clock period duration and the determination of the time deviation between clock edges can be performed in parallel. In this embodiment, the pulse shaper PSH and the signal processing unit are coupled via a control connection to exchange pulse shaper control signals PCT. In one embodiment the pulse shaper control signals PCT can, for example, comprise information about a successful determination of a phase deviation word or a first or a second data word.

In the embodiments of detection arrangements described above, the counter units can comprise a coincidence detector to detect a coincidence of clock edges at the respective delay pair and to derive the respective first or second data word from the coincidence detection as a function of a number of delay pairs which are passed through by the clock edges of the clock signals at the input side. The coincidence detector can comprise the detection elements DET, the decoder unit DTH, and the cycle counter CYC. The coincidence detector derives the first or the second data word, respectively, by determining a position of the coincidence within the first and the second delay ring and counting the number of clock cycles at a pair of delay elements of the first and the second ring.

Figure 5:
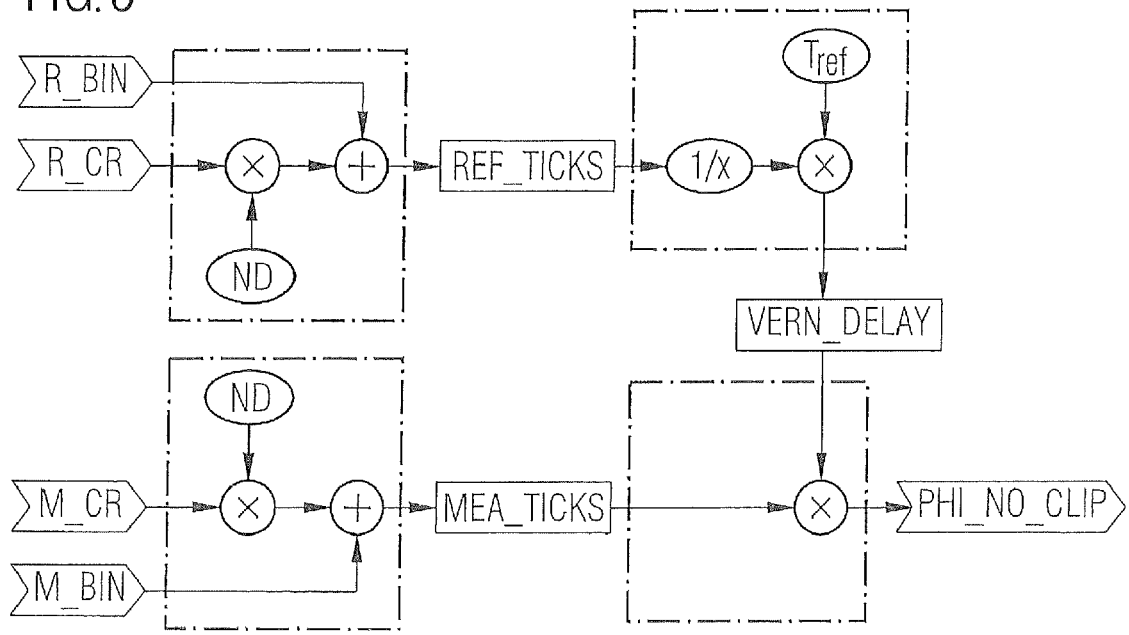
FIG. 5 is an embodiment of a signal processing unit.

FIG. 5 shows an embodiment of a signal processing unit SPU for deriving the phase deviation word. The signal processing unit SPU receives the first data word comprising a first position word and a first cycle word. The first cycle word represents a number of clock cycles in the dual delay ring DR, denoted by the value M_CR. The first position word represents the position of the delay pair where a coincidence of clock edges has occurred, denoted by the value M_BIN.

Accordingly, the signal processing unit SPU in one embodiment receives the second data word comprising information about the duration of a clock period of the reference clock signal, denoted by a cycle counter value R_CR and a position value R_BIN.

The total number of delay elements passed through by the clock edges which is denoted by the value MEA_TICKS is calculated in one embodiment by multiplying the cycle value M_CR by the number ND of the delay elements of a delay ring and adding the result to the position value M_BIN which can be expressed by $$MEA\_TICKS = M\_CR \cdot ND + M\_BIN$$

Accordingly, the total number of delay elements passed through by the clock edges of the reference clock signal is denoted by the value REF_TICKS which is calculated by multiplying the cycle value R_CR by the number of delay elements ND and adding the result to the position value R_BIN. This can also be expressed as $$REF\_TICKS = R\_CR \cdot ND + R\_BIN$$

The value REF_TICKS is inverted and multiplied by a value $T_{ref}$ which corresponds to a nominal value of a duration of a reference clock period. This operation results in the value VERN_DELAY which acts as normalizing factor for the value MEA_TICKS, expressed by $$VERN\_DELAY = T_{ref}/REF\_TICKS$$

The normalized phase deviation which is denoted by the value PHI_NO_CLIP can be expressed by

*PHI_NO_CLIP=MEA_TICKS·VERN_DELAY*

Depending on the delay pair to which the cycle counter is connected, it can be necessary in one embodiment to perform a correction of the cycle values R_CR, M_CR as a function of the position values R_BIN, M_BIN. If the cycle counter, for example, is connected to the middle of the delay ring, that means after about half the number of delay elements or detection elements in the delay ring, the cycle value can be too large, if the coincidence detection occurs in the second half of the delay ring. In one embodiment, the cycle value may be decreased before calculating or deriving the phase deviation value PHI_NO_CLIP.

Also, in another embodiment, further processing of the phase deviation value PHI_NO_CLIP is possible. For example, an offset value can be provided to the phase deviation value which may be needed for generating the phase deviation word. It is also possible to perform a clipping of the phase deviation value PHI_NO_CLIP depending on the clipping value, for example if the value PHI_NO_CLIP is outside a range of values that can be evaluated by a circuit connected to the signal processing unit. In a similar way, the phase deviation value PHI_NO_CLIP can be scaled by a scaling factor, for example to be able to use a given range of values better or to provide the value with the given unit, as a time in a given fraction of a second. Also a combination of different operations is possible. In all cases, the processed result is provided as the phase deviation word at the output OTD.

Figure 6A:
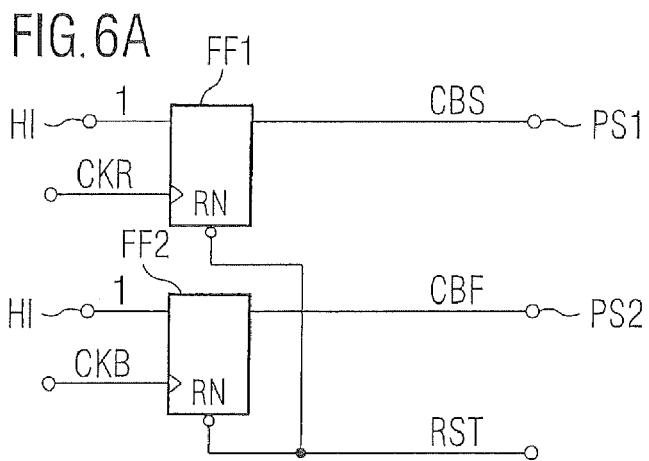
FIGS. 6A and 6B are embodiments of a first and a second pulse shaper, FIGS. 7A and 7B, collectively, is a further embodiment of a first and a second pulse shaper.

FIG. 6A shows an embodiment of a pulse shaper which can be used to generate auxiliary clock signals for determining a time deviation between clock edges of a first clock signal and a reference clock signal. The pulse shaper comprises a first and a second flip flop FF1, FF2, each comprising a data input which is coupled to a logic tap HI to receive a high logical value. A clock input of the first flip flop FF1 is provided with the reference clock signal CKR. Accordingly, the second flip flop FF2 is provided with the first clock signal CKB. The flip flops FF1, FF2 each comprise a reset input RN to receive a reset signal RST.

A first auxiliary clock signal CBS, which is provided at the pulse shaper output PS1, is generated by the first flip flop FF1 as a function of the reference clock signal CKR. Assuming that the first auxiliary clock signal CBS has a low logical value after resetting the flip flop FF1 through a pulse in the reset signal RST, a first clock edge is generated depending on a clock edge of the reference clock signal CKR, such that the auxiliary clock signal CBS has a high logical value.

Accordingly, the second auxiliary clock signal CBF, which is provided at the second pulse shaper output PS2, changes from a low logical value to a high logical value depending on the clock edge of the first clock signal CKB. As the data inputs of the flip flops FF1, FF2 receive a high logical value, the auxiliary clock signals CBS, CBF remain on their high logic level until the flip flops FF1, FF2 receive another reset pulse. Therefore the pulse width of the auxiliary clock signals is higher than the pulse width of the respective input clock signals.

The reset signal RST can be dependent on a completed measurement of a time deviation between the clock edges of the auxiliary clock signals CBS, CBF or on following clock edges of the first clock signal CKB and the reference clock signal CKR, respectively.

In one embodiment, by using the auxiliary clock signals CBS, CBF in the counter unit CUN, the delay rings which form a first and a second ring oscillator are triggered by one clock edge of the auxiliary clock signals CBS, CBF. Negative clock edges disturbing the detection process in the counter unit are avoided this way.

Figure 6B:
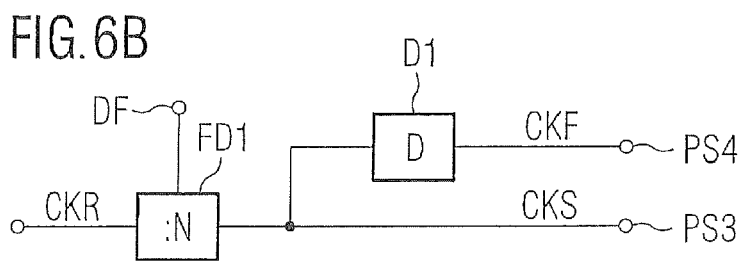

FIG. 6B shows another embodiment of a pulse shaper which can be used to generate auxiliary clock signals CKF, CKS for determining a duration of a clock period of the reference clock signal. To this end, a frequency divider FD1 is provided which performs a frequency division of the reference clock signals CKR depending on a division factor provided at a control input DF. The duty cycle of the reference clock signal CKR and the frequency divided auxiliary clock signal CKS are not necessarily identical, in one embodiment. Similar to the embodiment shown in FIG. 6A, the frequency divided auxiliary clock signal CKS at the output of the frequency divider FD1 can have a longer period of logical high than of a logical low. Therefore also here the pulse width of the auxiliary clock signals is higher than the pulse width of the respective input clock signals.

The pulse shaper of FIG. 6B further comprises a delay element D1 which delays the frequency divided auxiliary clock signals CKS by one clock period of the reference clock signal CKR, which results in a second auxiliary clock signal CKF. Therefore, in one embodiment the auxiliary clock signals CKS, CKF comprise clock edges with a time deviation between the clock edges corresponding to a clock period of the reference clock signal CKR. The auxiliary clock signals CKF, CKS which are provided at the pulse shaper outputs PS3, PS4 can be used to determine the duration of a clock period of the reference clock signal CKR in the counter unit.

Figure 7B:
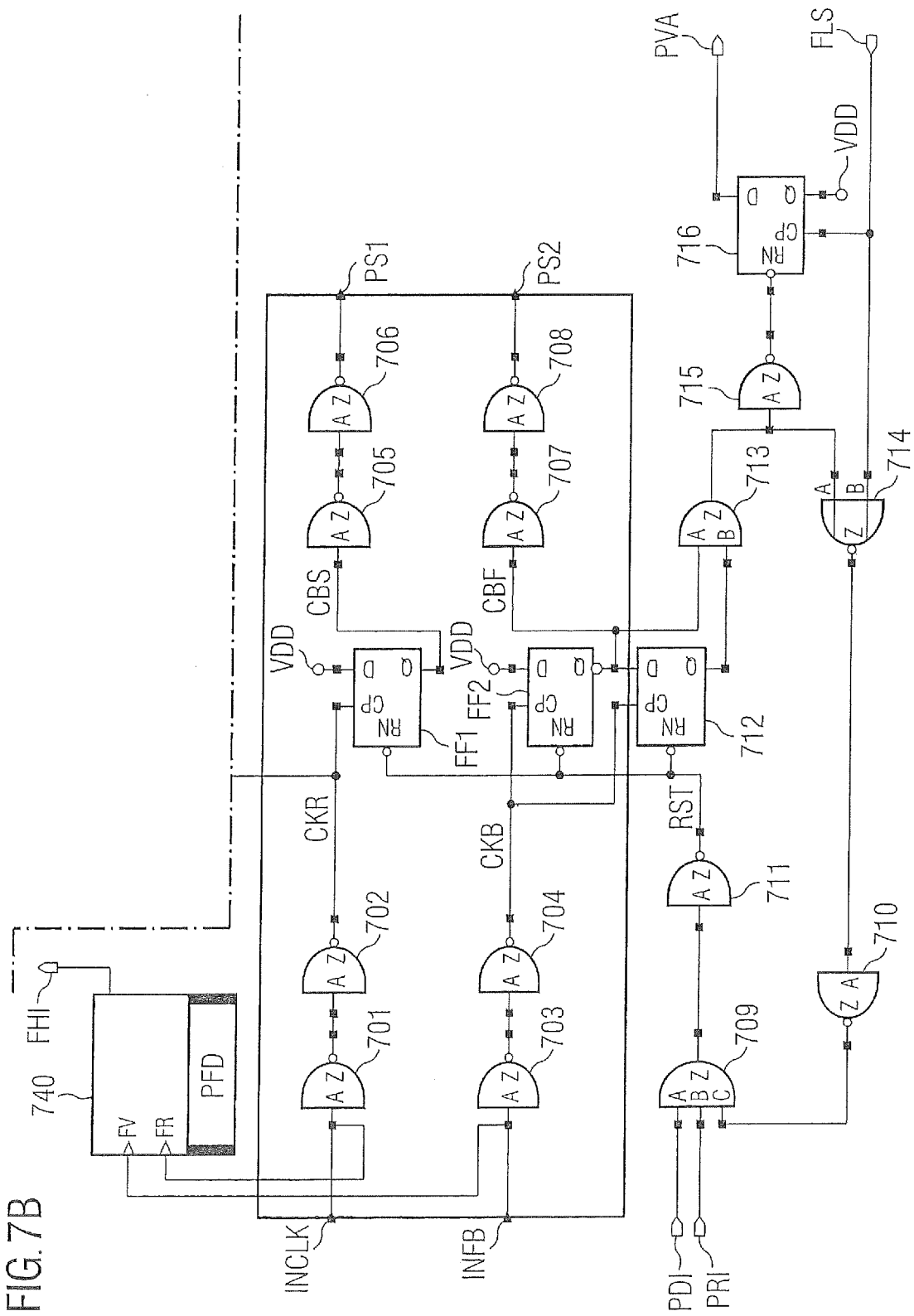

FIG. 7 shows another embodiment of a pulse shaper for both generating auxiliary clock signals CBS, CBF for determining a time deviation between the first clock signal CKB and the reference clock signal CKR, and for generating auxiliary clock signals CKS, CKF for determining a duration of a clock period of the reference clock signal CKR. The pulse shaper comprises clock inputs INFB and INCLK to receive the first clock signal CKB and the reference clock signal CKR. Inverter elements 701, 702 and 703, 704, respectively, are provided to buffer the clock signals CKR, CKB. The flip flops FF1, FF2 correspond to the embodiment shown in FIG. 6A. Respective outputs of the flip flops FF1, FF2 are coupled to the pulse shaper outputs PS1, PS2 via the inverter elements 705, 706 and 707, 708, respectively, which also perform a buffering function.

The pulse shaper comprises an input FLS to receive a signal corresponding to a coincidence detection of clock edges, for example from the counter unit. Furthermore, inputs PDI, PRI are provided which are coupled to a delay pair of the counter unit to receive signals corresponding to a completion of a ring cycle. The inputs PDI, PRI are connected to a first and a second input of an AND-gate 709 whose third input is coupled to an output of a NOR-gate 714 over an inverter element 710. An output of the AND-gate 709 is coupled to the flip flops FF1, FF2 and to a third flip flop 712 over an inverter element 711 for providing a reset signal RST for resetting the respective flip flops FF1, FF2, 712.

An output of the flip flop 712 reaches a high logical value after a second positive clock edge of the first clock signal CKB, counted from the last resetting of the respective flip flops. The outputs of the second flip flop FF2 and the third flip flop 712 are coupled to an AND-gate 713 whose output is connected to the first input of the NOR-gate 714 and to a flip flop 716 over an inverter element 715. A second input of the NOR-gate 714 is connected to the input FLS. An output PVA is coupled to an output of the flip flop 716 which is triggered by a signal at the input FLS.

A reset pulse in the reset signal RST can be generated either if a pulse at the input FLS is received or if a second clock edge of the first clock signal CKB occurs, in each case generating a logical high at the output of the inverter element 710. Depending on the signals at the inputs PDI, PRI, the flip flops FF1, FF2, 712 can be reset in these cases.

In other words, the pulse shaper generates a first and a second auxiliary clock signal CBS, CBF, each comprising a first and a second clock edge. Thereby, the first clock edge of the first auxiliary clock signal depends on a first clock edge of the first clock signal CKB and the first clock edge of the second auxiliary clock signal CBS depends on a first clock edge of the reference clock signal CKR. The second clock edges of the first and the second auxiliary clock signal CBS, CBF each depend on either a detection signal provided at the input FLS or a second clock edge of the first clock signal CKB.

Figure 8A:
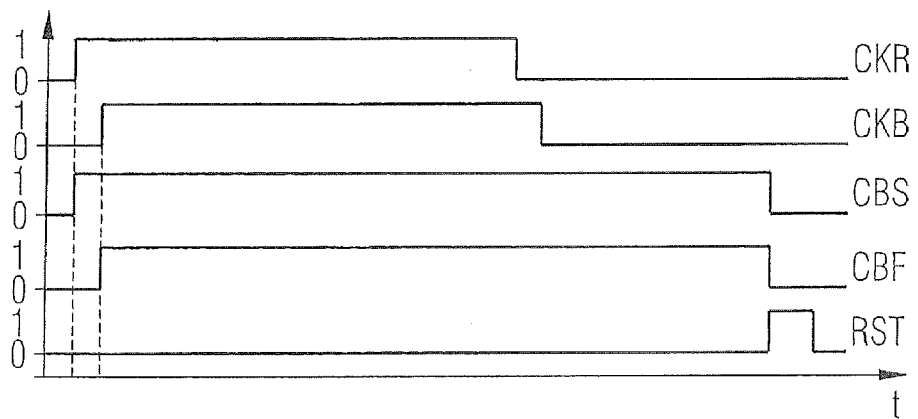
FIGS. 8A and 8B are signal time diagrams of signals in pulse shapers.

FIG. 8A shows an exemplary signal time diagram of signals within the pulse shaper PSH according to one embodiment. It can be seen that the first clock edge of the auxiliary clock signal CBS corresponds to the positive clock edge of the reference clock signal CKR. Accordingly, the positive clock edge of the other auxiliary clock signal CBF corresponds to the positive clock edge of the first clock signal CKB. The auxiliary clock signal CBS, CBF remain at a high logic level although after the first clock signal CKB and the reference clock signal CKR have returned to a low logic level. The auxiliary clock signals CBS, CBF return to a low logic level with the reset pulse of the reset signal RST. The pulse width of the output clock signals CBS, CBF is changed compared to the respective input clock signals CKB, CKR.

Referring back to FIG. 7, the pulse shaper comprises a frequency divider FD1 comprising an inverter element 717, flip flops 718, 719, 720, 721, inverter elements 722, 731, 732, 734, and logical gates 735, 736, 737, 738, 739. A division ratio can be provided at the control inputs DF1, DF2, DF3, DF4. For example, a division ratio can be chosen being greater than a ratio between a delay time $T_D$, $T_R$ of a delay element and the respective delay difference $\Delta T$ between the delay times $T_D$, $T_R$.

The delay element D1 of the pulse shaper comprises logical elements 723, 724, 725, 726, 727, 728 and flip flops 729, 730 which effect that the frequency divided auxiliary clock signals CKS, CKF comprise a delay between clock edges corresponding to a clock period of the reference clock signal CKR.

The flip flops 718 to 721 form a counter, which is triggered by the reference clock signal CKR via the inverter element 717. The counter is reset depending on the logical function of the logical elements 735 to 739 in combination with the inverter element 722.

The logical elements 723 to 728 evaluate the output of the counter of the frequency divider FD1 and generate pulses at the inputs of the flip flops 729, 730 which are synchronized by the reference clock signal CKR.

Figure 8B:
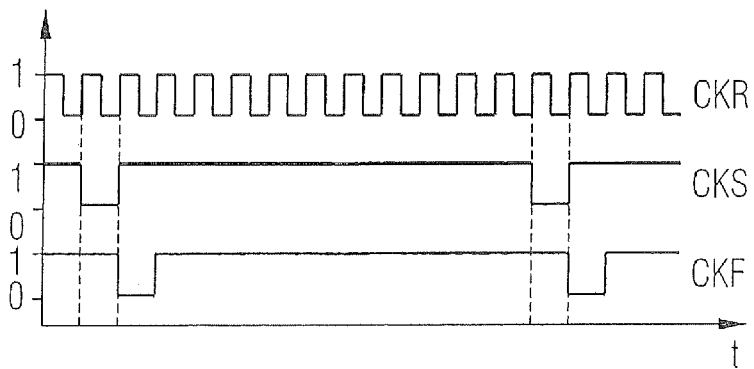

FIG. 8B shows another exemplary signal time diagram of clock signals within the pulse shaper PSH according to one embodiment. The auxiliary clock signal CKS is set to a low logical value with one rising edge of the reference clock signal CKR and to a high logical value with a respective following positive rising clock edge of the reference clock signals CKR. Accordingly, the other auxiliary clock signal CKF is generated with a delay of one clock period of the reference clock signal CKR compared to the auxiliary clock signal CKS. In this embodiment a division factor of 12 is realized. Also other division factors are possible as mentioned above. Again, the pulse width of the output clock signals CKS, CKF is changed compared to the respective input clock signal CKR.

Referring back to FIG. 7, the pulse shaper further comprises a phase frequency detector 740 which comprises inputs FV, FR coupled to the clock inputs INCLK and INFB, respectively. The phase frequency detector 740 comprises an output FHI to provide a detection signal. The phase frequency detector 740 performs a coarse phase and/or frequency detection. Therefore it can be detected, if a phase deviation between the first clock signal CKB and the reference clock signal CKR is too large to be measured by the respective counter unit. This can, for example, happen if the flip flops FF1, FF2 are reset before the counter unit was able to detect the coincidence of clock edges. In this case, the detection signal of the phase frequency detector 740 can be evaluated by the signal processing unit which can, for example, provide a maximum or minimum value for the phase deviation word, indicating that a coarse phase deviation has occurred.

Signals at the connections FLS, PVA and FHI can be regarded as pulse shaper control signals PCT shown in FIG. 4, for example.

Figure 9:
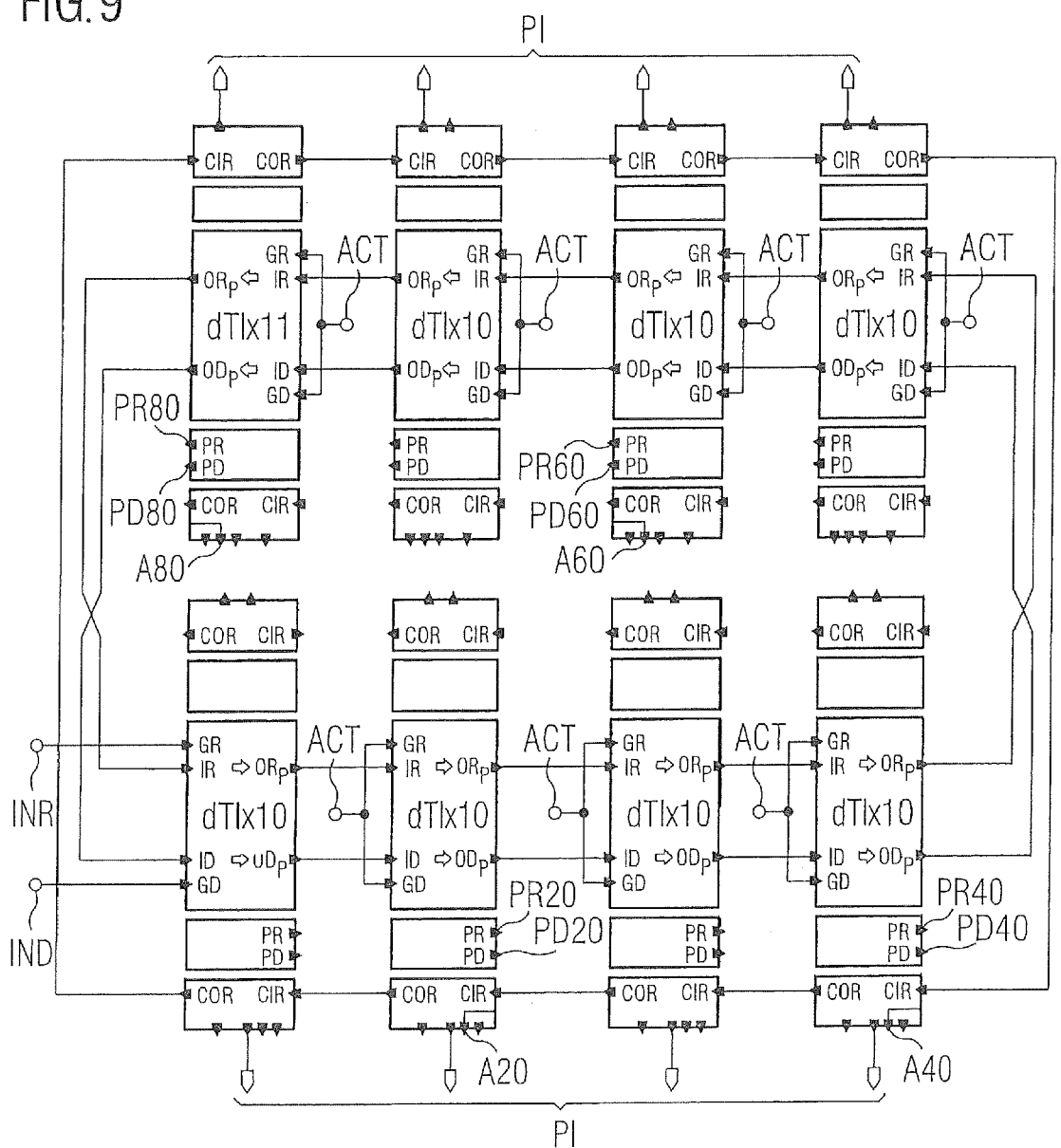
FIG. 9 is an embodiment of an oscillator ring.

FIG. 9 shows a schematic overview of an embodiment of a dual ring oscillator with respective detection elements. Being a part of a counter unit, the ring oscillator comprises inputs INR, IND for receiving a first and a second clock signal. The first and the second clock signal can, for example, be auxiliary clock signals CBS, CBF provided by the pulse shaper corresponding to the reference clock signal and the first clock signal to be compared. The clock signals at the inputs INR, IND can also be the auxiliary clock signals CKS, CKF corresponding to delayed versions of the frequency divided reference clock signal. In other words, the oscillator ring shown in FIG. 9 can be used for both the determination of a time deviation between clock edges of the first clock signal and the reference clock signal and a determination of a duration of a clock period of the reference clock signal.

In the embodiment shown, the oscillator ring comprises eight delay and detection blocks, each comprising ten delay elements of the first delay ring, ten delay elements of the second delay ring, and ten detection elements, wherein the uppermost left delay and detection block comprises one additional delay pair and one additional detector element. Therefore, in this embodiment, the delay rings each comprise 81 delay elements coupled together. It is desirable to provide an odd number of delay elements in a single delay ring, especially if the delay elements are realized as inverter elements, to make an oscillation within the oscillator rings possible.

The number N of delay elements in the oscillator ring together with the delay times $T_D$, $T_R$ of a single delay element determine an oscillating frequency of the respective oscillator rings. That means that the oscillating frequency can be reduced by increasing the number N of delay elements. A lower oscillating frequency makes a coincidence detection and evaluation easier, but increases, for example, space needed on an integrated circuit and the power consumption of the oscillator rings. Therefore, the number N of delay elements can be varied according to these known conditions.

Each of the delay and detection blocks comprises ring inputs IR, ID which are coupled to respective outputs ORP, ODP of a preceding delay and detection block. The clock signals to be delayed and to be evaluated by the detection elements are provided and received over these connections. The delay and detection blocks further comprise gating inputs GR, GD. The gating inputs GR, GD of the lower left delay and detection block are coupled to the clock inputs IND, INR, respectively. The gating inputs GR, GD of the remaining delay and detection blocks are each coupled to an activation input ACT which, for example, can be a switchable supply voltage tap. A high logic level at the gating inputs GR, GD makes a forwarding or delaying of the clock signals within the delay elements possible. Hence, a positive clock edge at the clock input INR, IND can trigger an oscillation of the respective oscillator ring.

The delay and detection blocks further comprise detection pattern inputs CIR which are coupled to respective neighboring detection pattern outputs COR to perform a pattern detection within the coincidence detection results. This will be explained in more detail for FIG. 15.

The delay and detection blocks comprise outputs to provide the position information PI, for example to the decoder unit DTH. Further outputs PR20, PD20, PR40, PD40, PR60, PD60 and PR80, PD80 can be used to provide additional clock signals derived from the delayed clock signals within the first and the second delay ring. This is also the case for the additional clock outputs A20, A40, A60 and A80. For example, the outputs PR80, PD80 can be coupled to the inputs PDI, PRI of the pulse shaper shown in FIG. 7 to indicate a complete cycle of the clock signals within the first and the second oscillator ring. The clock signals at the outputs PR20, PD20 to PR80, PD80 can also be used for a synchronization of the position information and a result of a cycle counter CYC.

Figure 10:
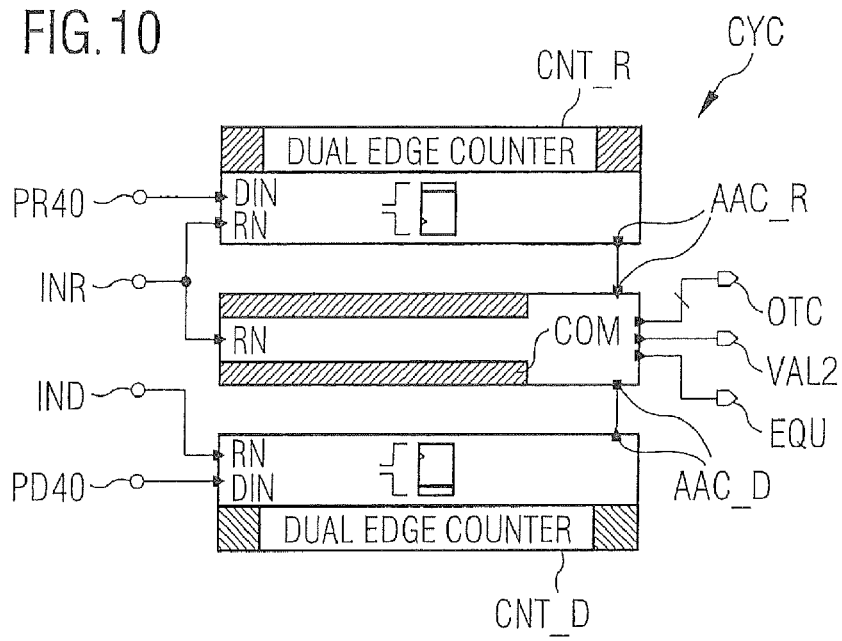
FIG. 10 is a first embodiment of a cycle counter.

FIG. 10 shows an embodiment of a cycle counter CYC which comprises a first dual edge counter CNT_R and a second dual edge counter CNT_D. The cycle counter CYC further comprises a comparison element COM. The dual edge counter CNT_R comprises a counter input DIN which is coupled to the clock output PR40 in this embodiment. Accordingly, the clock input DIN of the second dual edge counter CNT_D is coupled to the clock output PD40. A reset input RN of the first dual edge counter CNT_R and the comparison element COM are coupled to the first clock input INR, whereas the reset input RN of the second dual edge counter CNT_D is coupled to the second clock input IND. Both dual edge counters CNT_R and CNT_D count positive and negative clock edges of the respective clock signals at the clock outputs PR40 and PD40, respectively. The respective counting results AAC_R, AAC_D are provided to the comparison element COM. The comparison element COM compares the counter values AAC_D and AAC_R, derives an equal signal which is provided at the output EQU, a valid signal which is provided at the output VAL2 and a cycle word at the output OTC.

As the clock inputs DIN of the dual edge counters CNT_R, CNT_D are coupled to the clock outputs PR40, PD40 in the middle of the oscillator rings, that means after half the delay elements of the oscillator ring, a correction of the cycle word within the signal processing unit may be necessary.

Figure 11:
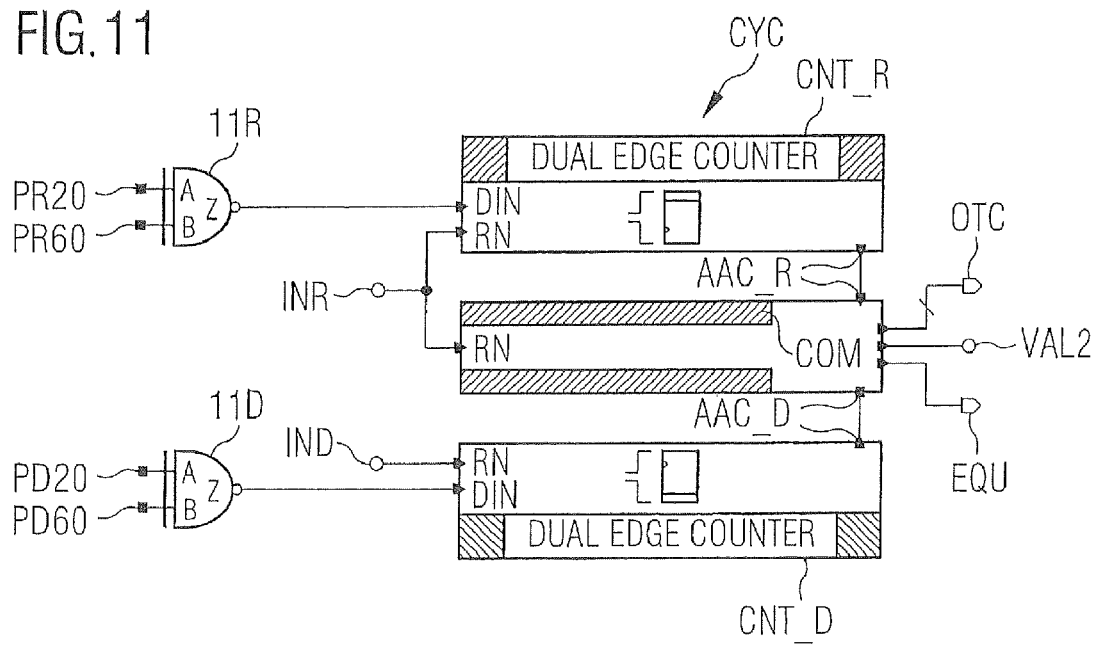
FIG. 11 is a second embodiment of a cycle counter.

FIG. 11 shows another embodiment of a cycle counter CYC. In this embodiment, the clock inputs DIN of the dual edge counters CNT_R. CNT_D are coupled to the clock outputs PR20, PR60 and PD20, PD60, respectively, via respective logical elements 11R, 11D. Hence, clock edges are counted by the dual edge counter CNT_R, CNT_D for every clock edge at, for example, the $20^{th}$ delay element and the $60^{th}$ delay element, resulting in a counting value AAC_R, AAC_D, respectively, being twice the number of actual clock cycles within the ring oscillators. This known behavior can easily be corrected within, for example, the comparison element COM. The additional information from the counting value AAC_R, AAC_D, respectively, can be used, for example, for a synchronization or validation of a position information PI from the detection elements. Therefore the additional information can also be used to determine a numerical range of the position information PI or the position word respectively.

In another embodiment more than two counters, for example four counters can be used for the cycle counter CYC which are coupled to different clock outputs of the delay rings. The additional counting information can also be used to make a determination of a numerical range of the position information PI easier.

Figure 12:
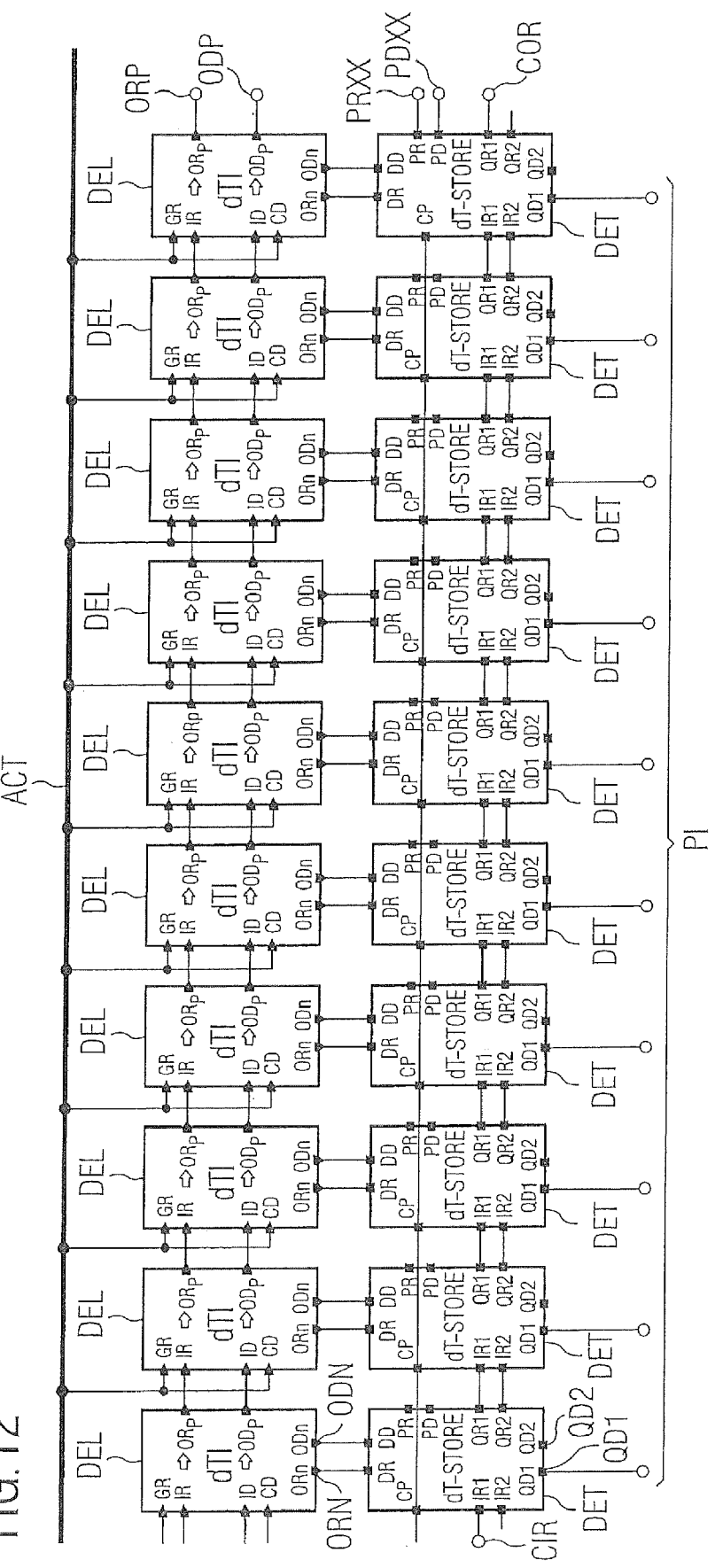
FIG. 12 is an embodiment of a detail of a counter unit.

FIG. 12 shows an embodiment of a delay and detection block which, for example, can be used within the dual oscillator ring shown in FIG. 9. It comprises ten delay elements each comprising a delay pair and a respective number of detection elements DET. Each of the delay blocks DEL comprises clock inputs IR, ID and gating inputs GR, GD. The gating inputs GR, GD of the leftmost delay pair can be either coupled to the clock inputs INR, IND, respectively, or to the activation input ACT, depending on the position of the delay and detection block within the oscillator rings.

The gating inputs GR, GD of the remaining delay blocks are coupled to the activation input ACT. Outputs ORN, ODN of the delay pairs are coupled to respective inputs DR, DD of the detection elements DET for determining whether a coincidence of clock edges of the delayed clock signals occurs. Further connections QR1, QR2 of the detection elements DET are coupled to connections IR1, IR2 of neighboring detection elements. The input IR1 of the leftmost detection element DET is coupled to the input CIR and the output QR1 and the rightmost detection element is coupled to the output COR.

A position information PI corresponding to a detection of a coincidence of clock edges of the delayed clock signals at the delay elements can be provided at respective outputs QD1 in one embodiment.

The detection elements further comprise a clock input CP for a synchronization of logical operations of the detection elements. Each of the detection elements DET comprises clock outputs PR, PD to provide clock signals derived from the delayed clock signals of the delay elements. For example, the rightmost detection element comprises clock outputs PR, PD which are coupled to clock outputs PRXX, PDXX of the delay and detection block, which, for example, can be one of the clock outputs PR20, PD20 to PR80, PD80 shown in FIG. 9.

Figure 13:
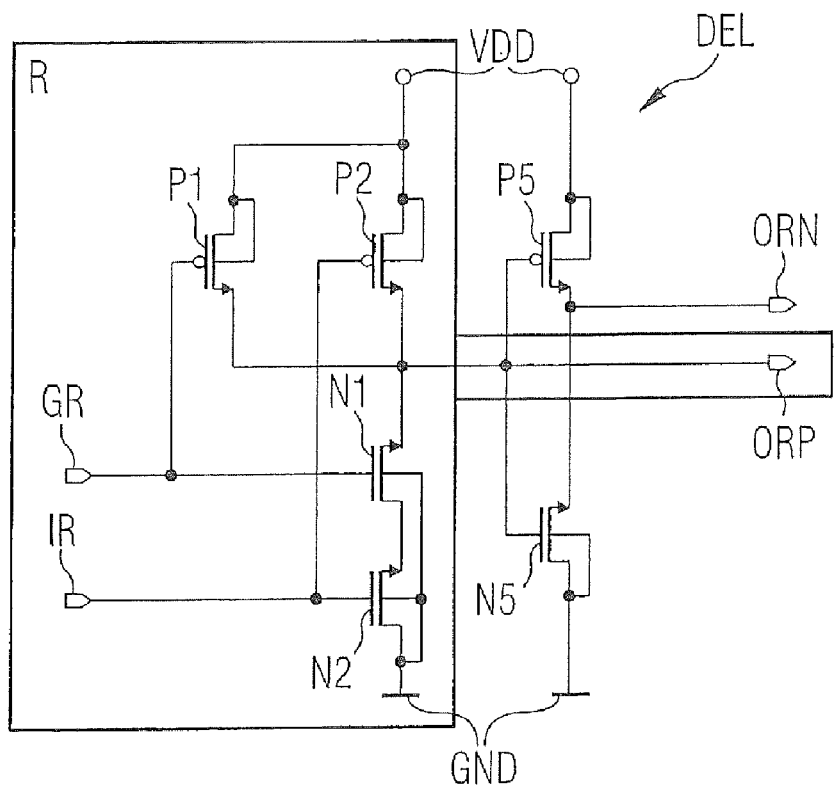
FIG. 13 is an embodiment of a pair of delay elements.
Figure 13:
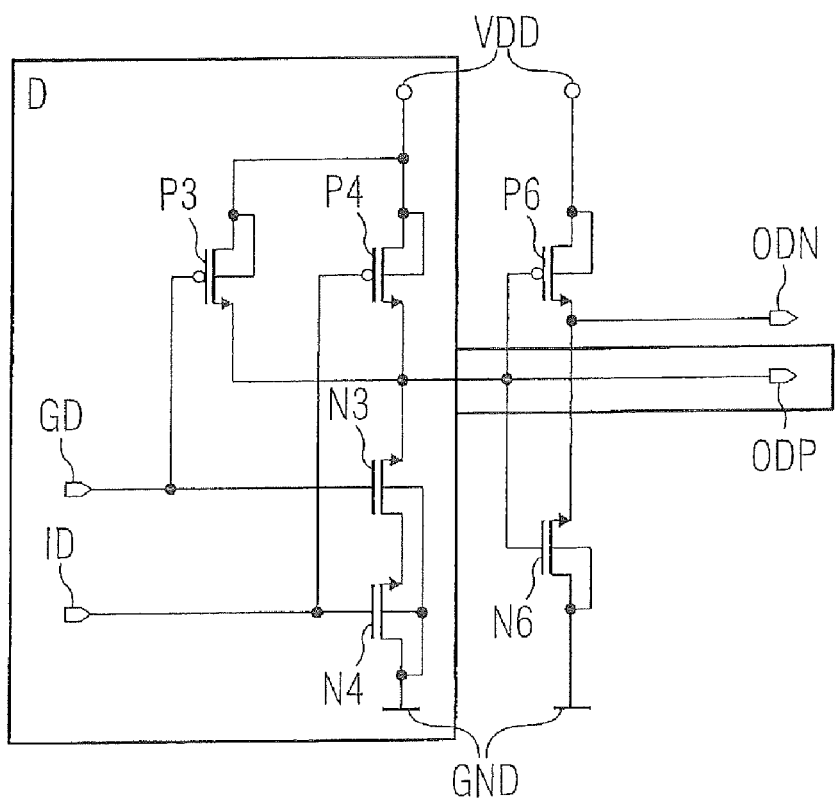

FIG. 13 shows an embodiment of a delay pair DEL which is realized as an inverter pair. In other words, the delay pair comprises two inverter elements which each comprise a NAND-gate comprising a first input IR, ID and a second input GR, GD, respectively. The NAND-gates are formed by transistors N1, N2, P1, P2 and N3, N4, P3, P4, respectively. The outputs of the NAND-gates are formed by the connections ORP and ODP, respectively.

The second inputs or gating inputs GR, GD can be connected to the clock inputs INR, IND or to the activation input ACT, as mentioned before.

Each of the inverter elements comprises an additional inverter formed by the transistors P5, N5 and P6, N6, respectively, the additional inverter element having outputs ORN, ODN. The signal paths of the NAND-gate and the additional inverters are coupled between a supply voltage tap VDD and a reference voltage tap GND.

The delay times $T_D$, $T_R$ of the inverter elements shown in FIG. 13 which depend on the switching times of the NAND-gates are different in one embodiment to realize the measurement principle according to Vernier. To this end, in one embodiment, the transistor dimensions of the transistors P1, P2, N1, N2 can be different from the transistor dimensions of the transistors P3, P4, N3, N4. For example a respective channel width/length ratio of field effect transistors P1, P2, N1, N2 can be different from the channel width/length ratio of field effect transistors P3, P4, N3, N4.

In another embodiment, the transistor dimensions of the first and the second inverter element may be equal but a capacitance which can be a parasitic capacitance at an output of the first inverter element can be different from a capacitance at an output of the second inverter element which also influences the switching time or delay time of the NAND-gates.

Instead of the NAND-gates, also other logical functions could be realized wherein delay times of the first and the second delay element or inverter elements differ.

Figure 14:
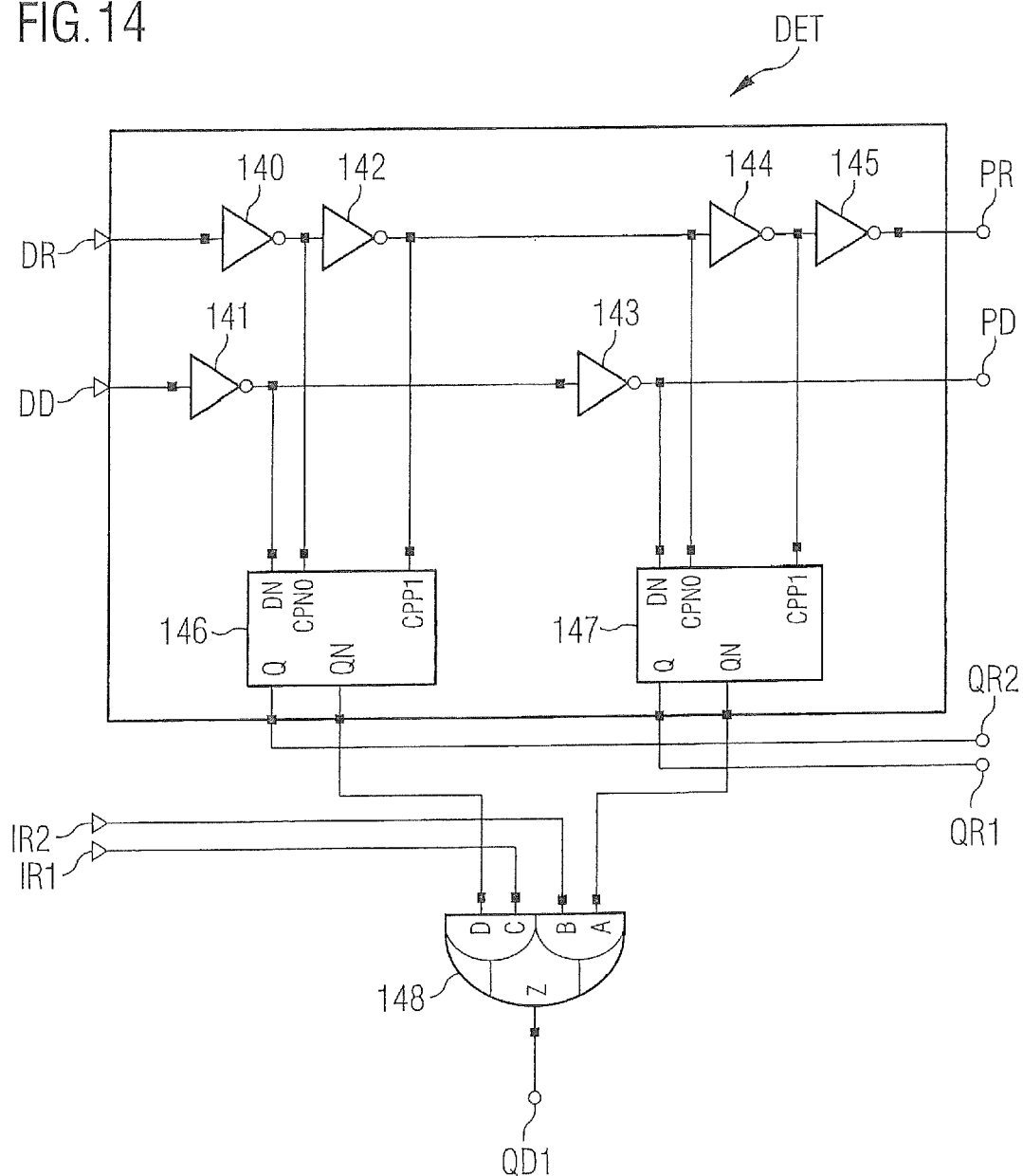
FIG. 14 is a first embodiment of a detection element.

FIG. 14 shows an embodiment of a detection element which, for example, can be used in a delay and detection block shown in FIG. 12. It comprises several inverter elements 140, 141, 142, 143, 144, 145 which couple the detection inputs DR, DD to detection flip flops 146, 147 and to two clock outputs PR, PD.

The first flip flop 146 comprises a data input DN which is coupled to the detection input DD via the inverter element 141, a first clock input CPNO which is coupled to the second clock input DR via the inverter element 140 and a second clock input CPP1 coupled to the second clock input DR via the inverter elements 140 and 142. In case of both clock signals at the detection inputs DR, DD showing the same clock edge at the same time, a respective output signal at the output Q, QN of the flip flop 146 is generated.

Accordingly, in one embodiment the second flip flop 147 is provided with input signals at its data input DN and its clock inputs CPNO and CPP1 which are inverted signals compared to the signals at the respective inputs of the flip flops 146. Therefore, with the two flip flops 146, 147, both a coincidence of positive clock edges at the detection input DR, DD and a coincidence of negative clock edges can be detected.

As shown in FIG. 12, the outputs Q of the flip flops 146, 147 are provided at the outputs QR1, QR2 which are coupled to the inputs IR1, IR2 of a neighboring detection element. The detection element DET further comprises a logical element 148 which is formed by two AND-gates and an OR-gate and comprises the output QD1 for providing a part of the position information PI. Therefore, the position information at the output QD1 does not only depend on the results provided by the detection flip flops 146, 147 but also on the information provided by a preceding detection element at the inputs IR1, IR2 which is evaluated together in a logical element 148. Hence, the accuracy of the coincidence detection can be improved using the logical element 148.

Figure 15:
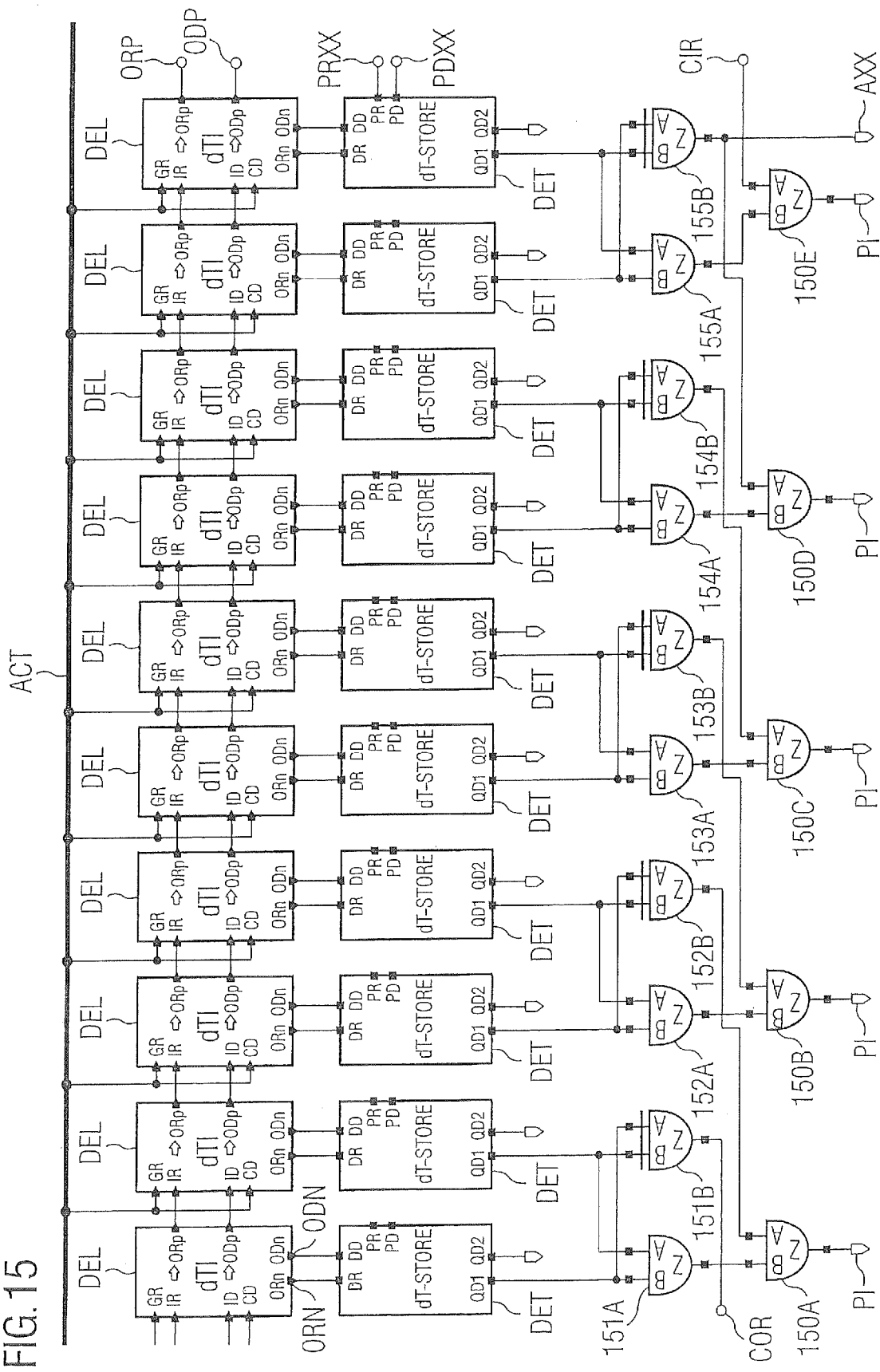
FIG. 15 is an embodiment of a further detail of a counter unit.

FIG. 15 shows another embodiment of a delay and detection block. In addition to the embodiment shown in FIG. 12, the delay and detection block further comprises logical elements 150A to 155B which form a plurality of pattern detectors. The pattern detectors evaluate the detection information of the detection elements DET and derive the position information PI. By using a combination of logical AND and XOR-gates not only detection information of a single detection element but of four neighboring detection elements is evaluated, thus improving the accuracy of the position information PI. Furthermore, the time interval in which a detected clock edge coincidence can be processed is enlarged, making a synchronization between position information PI or the position word respectively, and the information of the cycle word easier.

In one embodiment, through the connection CIR, COR, the pattern detection is not limited to one delay and detection block. The connection AXX can be used for a further evaluation of the detection results of the delay and detection block. For example, the connection AXX corresponds to one of the outputs A20, A40, A60, A80 shown in FIG. 9.

Figure 16:
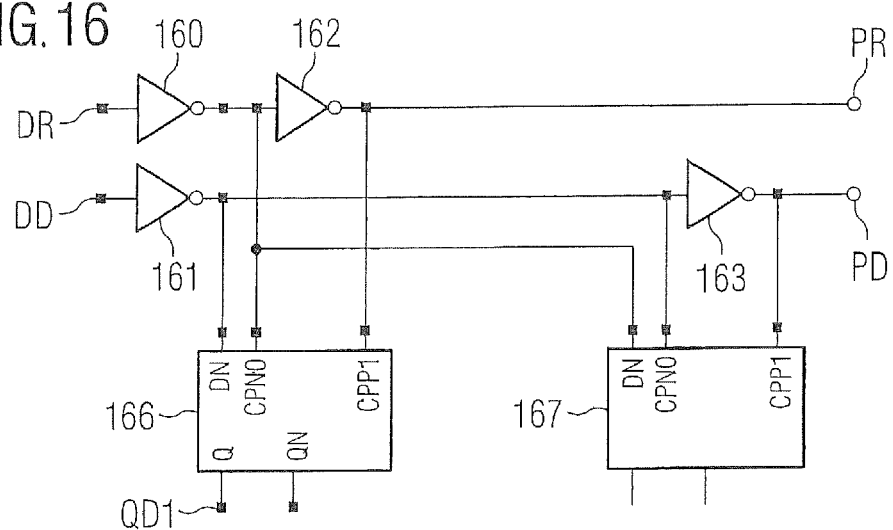
FIG. 16 is a second embodiment of a detection element.

FIG. 16 shows another embodiment of a detection element DET. Similar to the embodiment shown in FIG. 14, the detection element DET comprises inverter elements 160, 161, 162, 163 and detection flip flops 166, 167.

In this embodiment, only a coincidence of a positive or a negative clock edge of the clock signals at the detection inputs DR, DD can be detected. The respective result is provided at the output Q of the flip flop 166. The flip flop 167 is provided to have an equal, balanced load at the inputs DR, DD but does not have an evaluating function. Thus, the flip flop 167 could be omitted in another embodiment.

Figure 17:
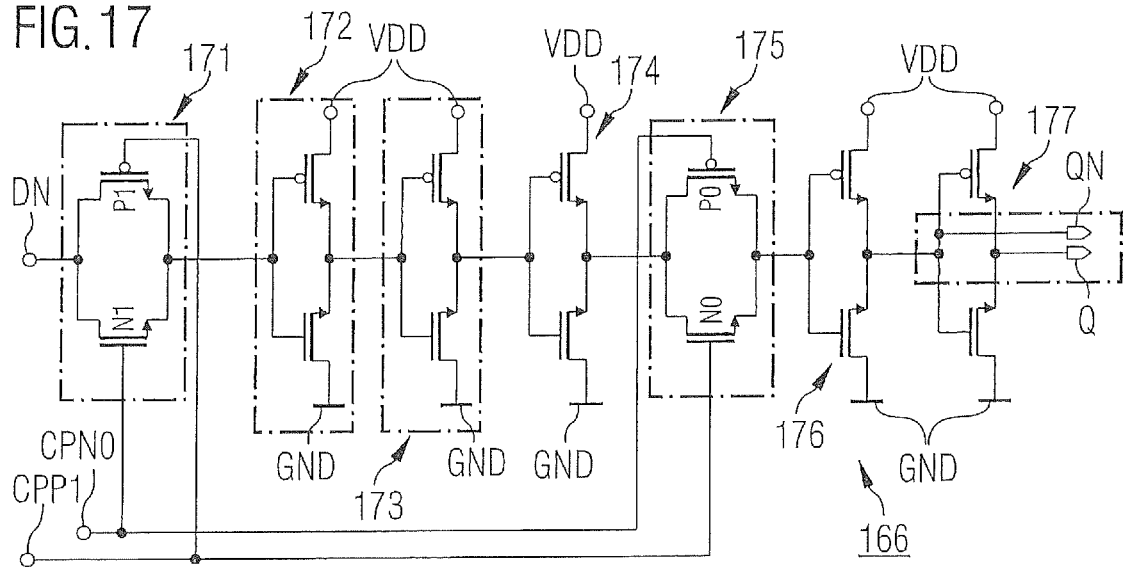
FIGS. 17 and 18 are embodiments of flip flop circuits.

FIG. 17 shows an embodiment of the detection flip flop 166. It comprises a series connection of a transistor switch 171, transistor inverters 172, 173, 174, a second transistor switch 175, and transistor inverters 176, 177. The output of the inverter 176 forms the output QN of the flip flop 166 and the output of the inverter 177 forms the output Q which is coupled to the output QD1 in FIG. 16. The transistor switches 171, 175 each comprise two inputs which are coupled to the clock inputs CPNO, CPP1, wherein the switching logic of the switch 175 is inverted to the switching logic of the switch 171. In case of a clock edge coincidence, a respective output signal is provided at the outputs Q, QN.

The embodiment of the detection flip flop 166 can, for example, also be used for the flip flops 146 and 147 shown in FIG. 14.

Figure 18:
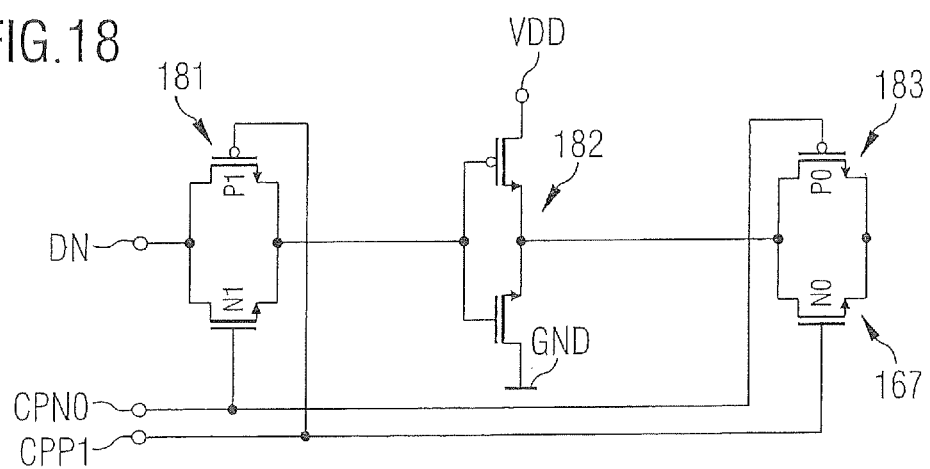

FIG. 18 shows an embodiment of the flip flop 167 which comprises a series connection of a first transistor switch 181, a transistor inverter 182, and a second transistor switch 183. The flip flop 167 comprises no output connection but can provide the same capacitive load through the transistor switches 181, 183 as the corresponding flip flop 166.

Figure 19:
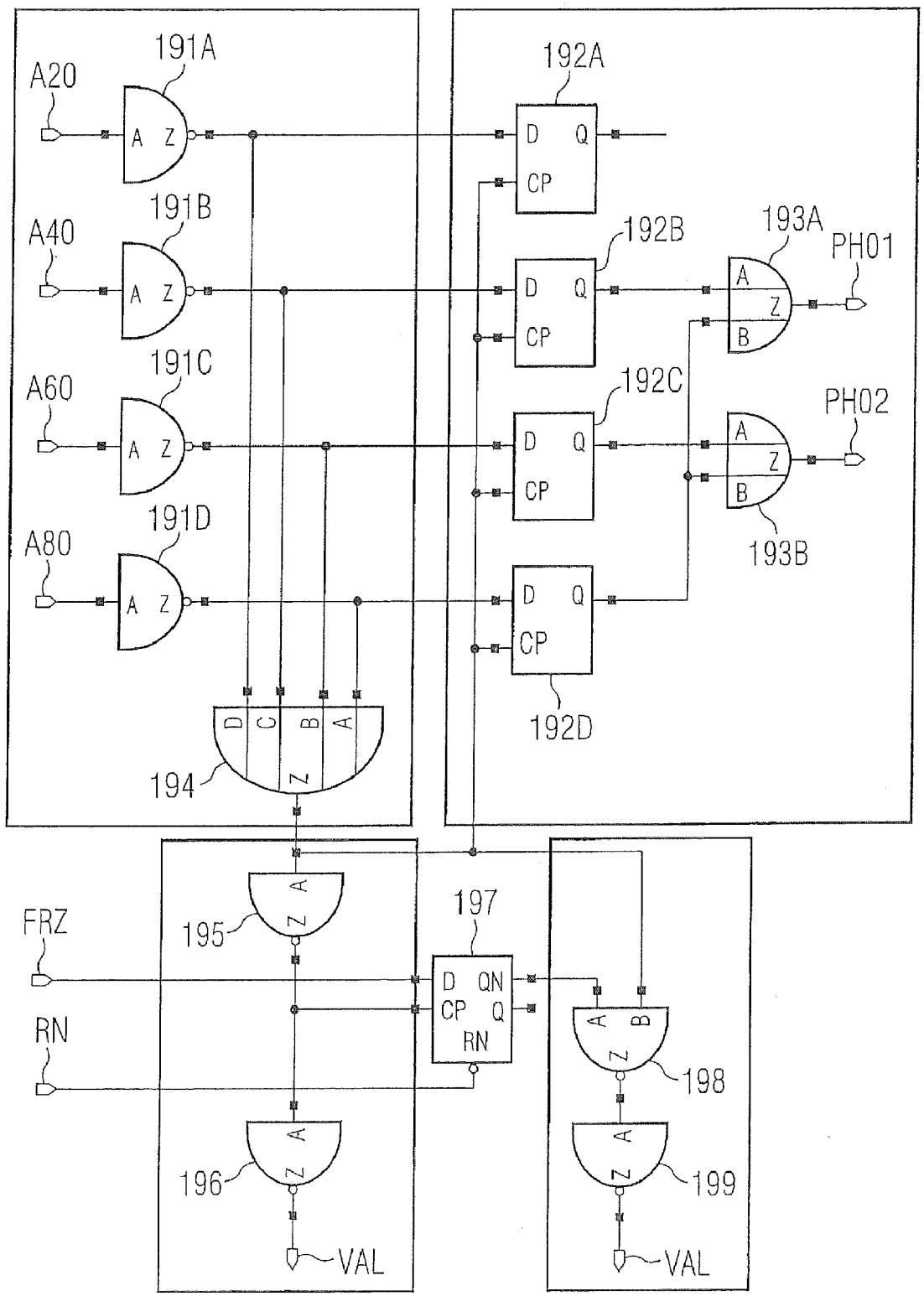
FIG. 19 is an embodiment of a further detection unit.

FIG. 19 shows an embodiment of a detection unit which can be used for providing additional information for deriving the position word from the position information PI. The detection unit comprises a quadruple OR gate 194 which is coupled to the clock outputs A20, A40, A60, A80, which are shown in FIG. 9, via inverter elements 191A, 191B, 191C, 191D. The output of the logical OR-gate 194 is coupled to the outputs VAL via inverter elements 195, 196 and logical elements 198, 199, respectively. The detection unit further comprises a flip flop 197 which can be triggered by a signal at the output of the inverter 195, comprising a data input D coupled to an input FRZ which, for example, is coupled to the valid output VAL2 of the comparison element COM shown in FIGS. 10 and 11. A reset input RN of the flip flop 197 can be coupled to the clock input INR, for example.

Depending on the valid signal provided by the comparison element COM, the detection unit can provide an information about a detection of a clock edge coincidence. As this information also depends on an information from the cycle counter CYC, this results in a synchronization between the cycle word and the position word and a determination of a numerical range of the position information PI.

In other words, in one embodiment the detection unit of FIG. 19 can be used as a coarse phase hit generator which is able to evaluate a coincidence of clock edges within the first and the second delay ring and provide information about a coarse determination of the numerical range of the position information PI. In this respect, a coincidence of clock edges can also be called a phase hit.

The detection unit further comprises flip flops 192A, 192B, 192C, 192D and logical OR-gates 193A, 193B, wherein the data inputs D of the flip flops are coupled to the respective outputs of the inverter elements 191A to 191D. The outputs of the OR-gates 193A, 193B are coupled to phase information outputs PHO1, PHO2 which represent a binary phase information. As there are four clock connections to the delay ring in this embodiment, the respective delay ring is divided into four quadrants of a full cycle. Therefore, the phase information at the outputs PHO1, PHO2 represents an information in which of the quadrants of the delay ring a phase hit, that means a coincidence of clock edges, has occurred. Also, this phase information can be used for synchronizing the position word and the cycle word, for example in the signal processing unit SPU or in the decoder unit DTH.

The number of clock connections in the detection unit is not limited to the shown four connections but can also be a smaller or a higher number, dividing the delay ring in less or more segments.

In other words, in one embodiment a numerical range of the position words can be derived by evaluating information about a coincidence of clock edges at several positions within the delay ring.

Figure 20:
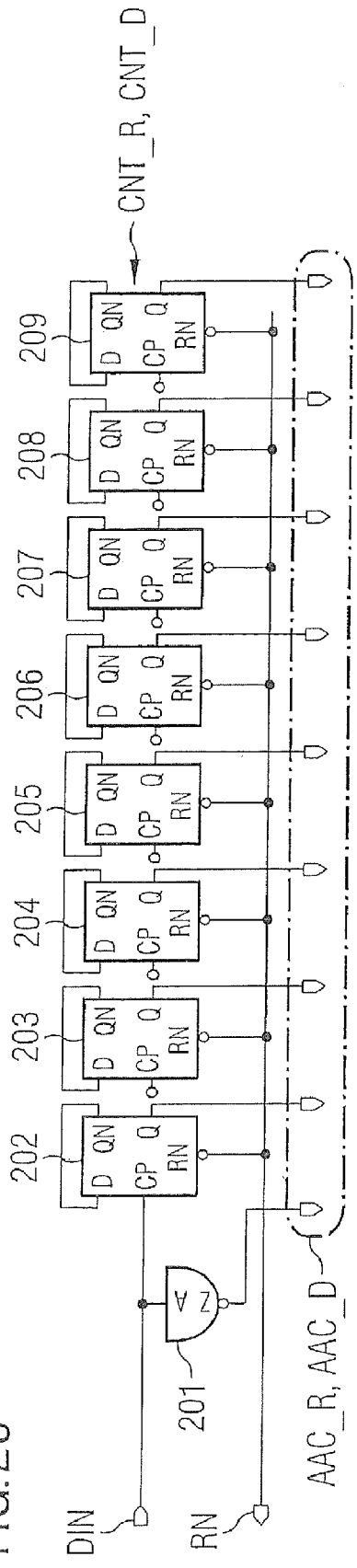
FIG. 20 is an embodiment of a dual edge counter.

FIG. 20 shows an embodiment of a dual edge counter CNT_R or CNT_D, respectively. The counter comprises an inverter element 201 and, as an example, eight flip flops 202 to 209. At each of the flip flops 202 to 209, the data input D and the inverting output QN are coupled with each other. The clock input CP of the flip flops 202 to 209 is coupled to the output QN of a preceding flip flop element or to the data input DIN for the first flip flop 202, respectively. The flip flops 202 to 209 each comprise a reset input coupled to the reset input RN of the counter. The output of the inverter element 201 and the respective output Q of the flip flops 202 to 209 form a respective counter value AAC_R or AAC_D, respectively.

Figure 21:
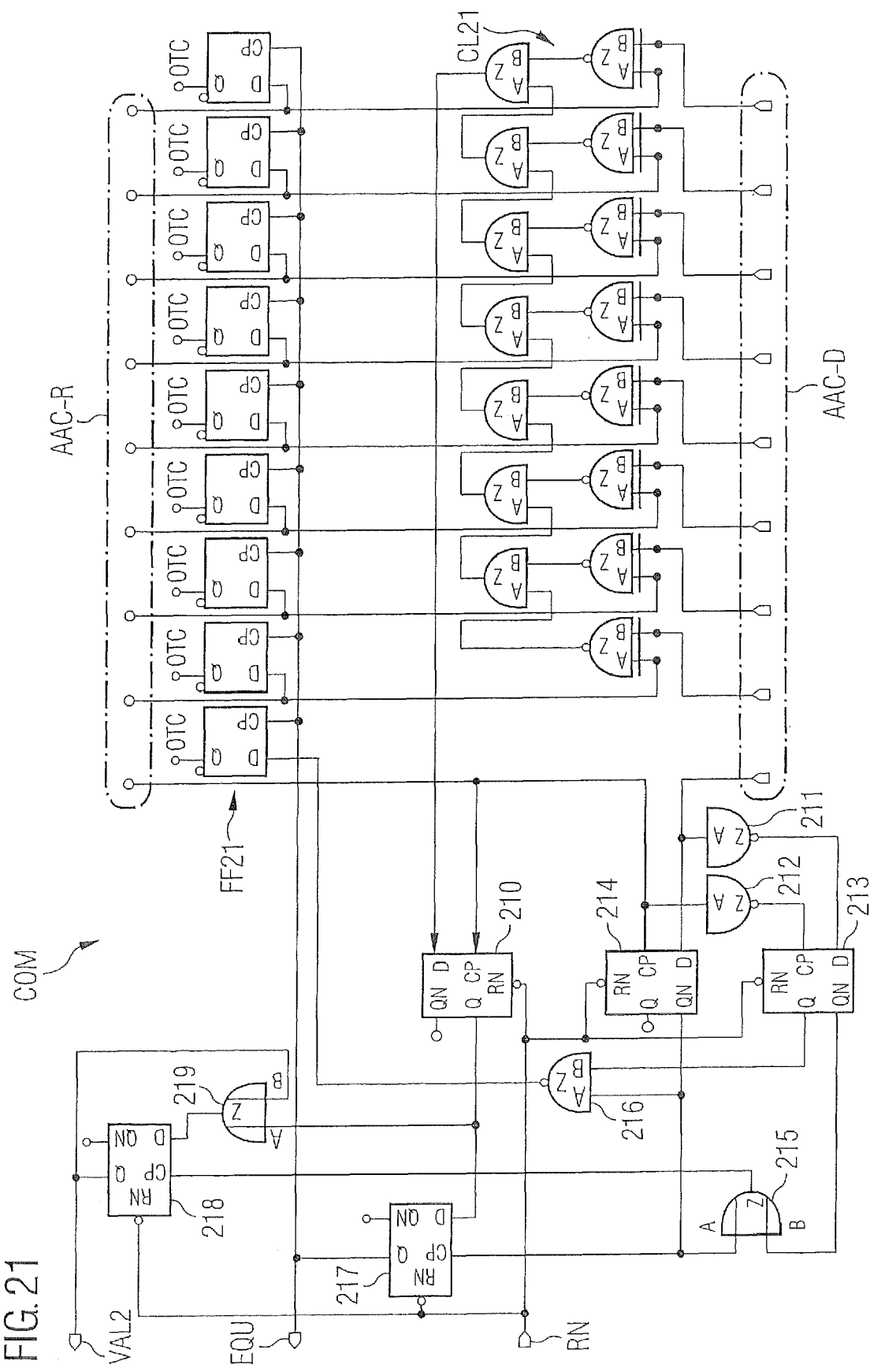
FIG. 21 is an embodiment of a comparison element.

FIG. 21 shows an embodiment of the comparison element COM. It comprises inputs for receiving the counter values AAC_R and AAC_D from the respective dual edge counters CNT_R, CNT_D. Referring to FIG. 20, the output of the inverter element 201 represent a least significant bit (LSB) of the respective counter value. The comparison logic CL21 comprises several logical gates for comparing the counter values AAC_R and AAC_D except the respective least significant bits. An output of the comparison logic 21 is coupled to the data input D of a flip flop 210 representing a result of the comparison of the most significant bits (MSB). The LSB of the counter value AAC_D is provided to a data input D of a further flip flop 214. Both the flip flop 210 and the flip flop 214 comprise a clock input CP with is provided with an LSB of the counter value AAC_R.

According to the flip flop 214, a flip flop 213 receives the LSBs of the counter values AAC_R and AAC_D via inverter elements 211, 212. With the flip flops 213 and 214 it can be determined whether both the LSBs of the counter values represent a logical 1 or both LSBs represent a logical 0. The outputs of the flip flops 213, 214 are evaluated by the logical gates 215, 216 and a flip flop 217 for generating an equal signal at the output EQU. An output of the flip flop 210 is evaluated via the logical element 219 and the flip flop 218 to generate a valid signal at the output VAL2. Depending on the equal signal, the output of the AND-gate 216 and the MSBs of the counter value AAC_R are provided to a bank of flip flops FF21 which are triggered by the equal signal for generating the cycle word at the output OTC. Therefore, the LSB of the cycle word comprises information about a position of a coincidence detection within the delay ring.

Figure 22:
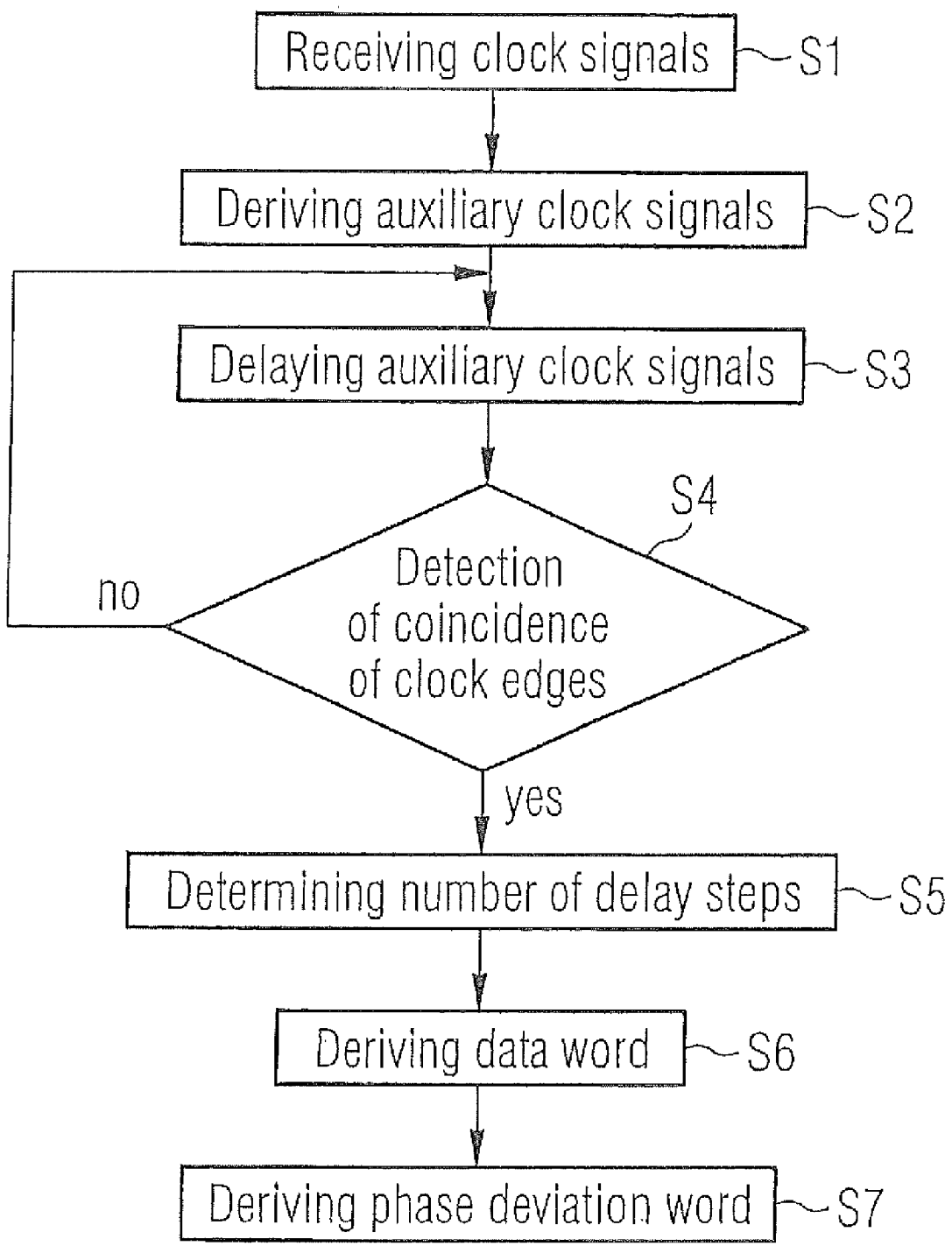
FIG. 22 is an embodiment of a detection method.

FIG. 22 shows an embodiment of a detection method. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

At S1, clock signals are received. The clock signals are, for example, a reference clock signal and a clock signal to be compared to the reference clock signal. At S2, auxiliary clock signals are derived from the clock signals received at S1. Deriving of the auxiliary clock signals, for example, comprises deriving a first and a second auxiliary clock signal CBS, CBF from the reference clock signal CKR and the clock signal CKB to be compared. For example, the first and the second auxiliary clock signals CBS, CBF are derived such that the first clock edge of the first auxiliary clock signal CBF depends on a first clock edge of the clock signal CKB to be compared, the first clock edge of the second auxiliary clock signal CBS depends on the first clock edge of the reference clock signal CKR, and the second clock edge of the first and the second auxiliary clock signal CBS, CBF each depends on a detection signal or on a second clock edge of the clock signal CKB to be compared.

Deriving the auxiliary clock signals can further comprise deriving a third and a fourth auxiliary clock signal CKS, CKF by frequency dividing the reference clock signal CKR and changing the duty cycle of the frequency divided clock signal such that the auxiliary clock signals CKS, CKF comprise a constant logical value for a larger part of the divided clock period than the respective other logical value. Furthermore, the third and the fourth auxiliary clock signal CKS, CKF derived from the reference clock signal CKR comprise a time deviation between clock edges corresponding to a clock period of the original reference clock signal CKR.

At S3, the auxiliary clock signals are delayed. For example, the first auxiliary clock signal CBF is delayed by a delay step comprising a first delay time and the second auxiliary clock signal CBS is delayed by a delay step comprising a second delay time which is different from the first delay time. In one embodiment, delaying the auxiliary clock signals comprises inverting the auxiliary clock signals.

At S4, it is detected whether clock edges of the first and the second auxiliary clock signal CBS, CBF are coincident, that means occur simultaneously. In case a coincidence of clock edges cannot be detected, it is continued with step S3. In case a coincidence of clock edges of the auxiliary clock signals could be detected, it is continued at S5.

S3 and S4 can also be performed for the third and the fourth auxiliary clock signal CKS, CKF generated or derived at S2. Furthermore, delaying and detecting of a coincidence of clock edges between the first and the second auxiliary clock signal CBS, CBF and between the third and the fourth auxiliary clock signal CKS, CKF can be performed sequentially or simultaneously.

At S5, a respective number of delay steps corresponding to the coincidence of clock edges of the delayed first auxiliary clock signal and the delayed second auxiliary clock signal is determined. Again, also a determination of a number of delay steps corresponding to a coincidence of clock edges between the third and the fourth auxiliary clock signals can be performed at S5.

At S6, a data word corresponding to the determined number of delay steps is derived. It is also possible that the first data word is derived corresponding to the number of delay steps for the first and the second auxiliary clock signal CBS, CBF and a second data word is derived for the number of delay steps for the third and the fourth auxiliary clock signal CKS, CKF.

In other words, the first data word corresponds to a time deviation between clock edges of a first clock signal CKB and the reference clock signal CKR and the second data word corresponds to a duration of a clock period of the reference clock signal CKR.

At S7, a phase deviation word is derived as a function of the first and the second data word. Deriving of the phase deviation word can comprise normalizing the first data word with respect to the second data word. Determining the phase deviation word can further comprise providing an offset value to the phase deviation word or clipping the phase deviation word depending on a clipping value or scaling the phase deviation word by a scaling factor.

Figure 23:
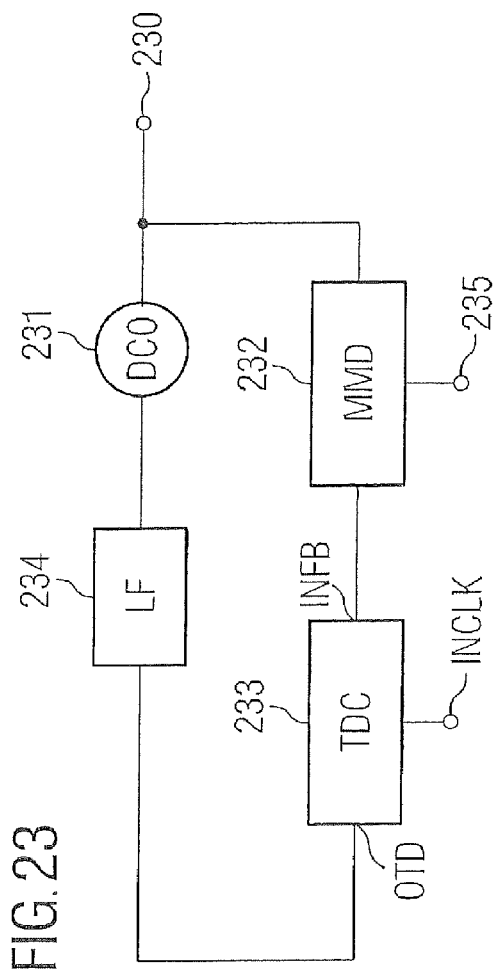
FIG. 23 is an embodiment of a phase locked loop.

FIG. 23 shows an embodiment of a phase locked loop comprising a controlled oscillator 231 (DCO) comprising a control input and an oscillator output 230. The phase locked loop further comprises a loop filter (LF) comprising a filter input which is coupled to the output OTD of a detection arrangement 233 and a filter output which is coupled to the control input of the controlled oscillator 231. A feedback input INFB of the detection arrangement 233 is coupled to the oscillator output 230 via a frequency divider or multi-modulus divider (MMD) 232 which comprises a control input 235 for providing a division ratio. The detection arrangement 233 further comprises a reference clock input INCLK for receiving a reference clock signal.

For the detection arrangement 233 one of the embodiments shown above can be used. For example, the detection arrangement comprises a counter unit CUN with an input coupled to the feedback input INFB to receive a first clock signal which is derived from the oscillator signal generated by the controlled oscillator. The counter unit CUN derives a first data word as a function of a time deviation between clock edges of the first clock signal and the reference clock signal. The detection arrangement further comprises a signal processing unit SPU coupled to the filter input of the loop filter via the output OTD, the signal processing unit SPU determining a phase deviation word as a function of the first data word and a second data word, wherein the second data word depends on a duration of a clock period of the reference clock signal.

In one embodiment, the controlled oscillator 231 comprises a digitally controlled oscillator. In another embodiment the controlled oscillator 231 comprises a VCO. The phase deviation word is digital/analog converted before or after loop filtering, but before providing it as a control signal to the VCO.

Therefore, in the embodiment shown in FIG. 23, an oscillator signal is generated as a function of a control signal provided by the loop filter 234. A first clock signal is derived as a function of the oscillator signal, for example by frequency dividing using the frequency divider 232. In the detection arrangement, a first data word is derived as function of a time deviation between clock edges of the first clock signal and the reference clock signal. Furthermore, a phase deviation word is determined as a function of the first data word and a second data word, wherein the second data word depends on the duration of a clock period of the reference clock signal. The control signal is adapted depending on the phase deviation word. For example, the adapting of the control signal comprises filtering the phase deviation word with the loop filter 234. In one embodiment, the control signal comprises a digital control word.

In the embodiments described above the cycle counters CYC can be omitted from the respective counter units. In these embodiments the numerical range of time deviations that can be measured is reduced, but the time deviation can be determined with less effort.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A detection arrangement, comprising:
   a first input configured to receive a first clock signal;
   a second input configured to receive a reference clock signal;
   a counter unit coupled to the first and to the second input, and configured to derive a first data word as a function of a time deviation between clock edges of the first clock signal and the reference clock signal; and
   a signal processing unit configured to determine a phase deviation word as a function of the first data word and a second data word, wherein the second data word depends on a duration of a clock period of the reference clock signal.

2. The detection arrangement of claim 1, wherein the counter unit is configured to operate in a first mode or a second mode of operation, wherein in the first mode of operation the first data word is derived, and wherein in the second mode of operation the second data word is derived as a function of clock edges of the reference clock signal.

3. The detection arrangement of claim 1, further comprising a further counter unit coupled to the second input, wherein the second counter unit is configured to derive the second data word as a function of clock edges of the reference clock signal.

4. The detection arrangement of claim 1, wherein the counter unit comprises a first and a second ring oscillator that are coupled to the first and the second input, respectively.

5. The detection arrangement of claim 1, wherein the counter unit comprises:
   a first and a second delay ring, each comprising a plurality of inverter elements, wherein the inverter elements of the first delay ring form respective inverter pairs with the inverter elements of the second delay ring, and wherein the inverter elements of the first delay ring comprise a first delay time and the inverter elements of the second delay ring comprise a second delay time different from the first delay time, and wherein a first inverter pair of the inverter pairs comprises an additional input coupled to the first and the second input, respectively; and
   a coincidence detector configured to detect a coincidence of clock edges at a respective inverter pair and to derive the first data word from the coincidence detection as a function of a number of inverter pairs which are passed through by the clock edges of the first clock signal and the reference clock signal at the point of coincidence.

6. The detection arrangement of claim 5, wherein the inverter elements each comprise a NAND-gate comprising a first input coupled to an output of a preceding inverter element and a second input, the second inputs of the respective first inverter elements coupled to the first and the second input, respectively, and the second inputs of the remaining inverter elements coupled to an activation tap.

7. The detection arrangement of claim 5, wherein a capacitance at an output of the inverter elements of the first delay ring is different from a capacitance at an output of the inverter elements of the second delay ring.

8. The detection arrangement of claim 5, wherein the inverter elements each comprise a transistor inverter circuit.

9. The detection arrangement of claim 8, wherein transistor dimensions of the inverter elements of the first delay ring are different from transistor dimensions of the inverter elements of the second delay ring.

10. The detection arrangement of claim 5, wherein the coincidence detector is configured to derive the first data word by determining a position of the coincidence within the first and the second delay ring and counting a number of clock cycles at a pair of inverter elements of the first and the second delay ring.

11. The detection arrangement of claim 5, wherein the coincidence detector comprises a decoder unit configured to convert a thermometer coded position information into a binary position word comprised by the first data word.

12. The detection arrangement of claim 1, wherein the signal processing unit is configured to determine the phase deviation word by normalizing the first data word with respect to the second data word.

13. The detection arrangement of claim 12, wherein the signal processing unit is further configured to determine the phase deviation word by at least one of the following:
   providing an offset value to the phase deviation word;
   clipping the phase deviation word depending on a clipping value; or
   scaling the phase deviation word by a scaling factor.

14. The detection arrangement of claim 1, further comprising a pulse shaper configured to couple the first and the second input to the counter unit, wherein the pulse shaper is configured to generate a first and a second auxiliary clock signal, each comprising a first and a second clock edge, the first clock edge of the first auxiliary clock signal based on a first clock edge of the first clock signal, the first clock edge of the second auxiliary clock signal based on a first clock edge of the reference clock signal and the second clock edge of the first, and the second auxiliary clock signal each based on a detection signal provided by the counter unit or on a second clock edge of the first clock signal.

15. The detection arrangement of claim 3, further comprising a pulse shaper configured to couple the first input to the further counter unit, the pulse shaper comprising a frequency divider configured to frequency divide the reference clock signal.

16. A counter unit, comprising:
   a first and a second clock input configured to receive a first and a second clock signal;
   a first delay ring comprising a plurality of delay elements, wherein each of the delay elements of the first delay ring comprise a first delay time, and wherein a first delay element of the first delay ring comprises an additional input coupled to the first clock input;
   a second delay ring comprising a plurality of delay elements corresponding to the plurality of delay elements of the first delay ring, wherein each of the delay elements of the second delay ring comprise a second delay time that is different from the first delay time, wherein a first delay element of the second delay ring comprises an additional input coupled to the second clock input;
   a plurality of detection elements corresponding to the plurality of delay elements of the first delay ring, wherein each detection element is coupled to an output of one of the delay elements of the first delay ring and to an output of a respective delay element of the second delay ring to detect a coincidence of clock edges at the respective outputs;
   a decoder unit coupled to the plurality of detection elements configured to generate a position word as a function of detection results of the detection elements;
   a cycle counter coupled to a pair of delay elements of the first and the second delay ring, and configured to count clock cycles of the first and the second delay ring and generate a cycle word based on the counted clock cycles; and
   a counter output configured to provide a data word comprising the position word and the cycle word.

17. The counter unit of claim 16, wherein the delay elements each comprise a NAND-gate comprising a first input coupled to an output of a preceding delay element and a second input, the second inputs of the respective first delay elements coupled to the first and the second clock input, respectively, and the second inputs of the remaining delay elements coupled to an activation tap.

18. The counter unit of claim 16, wherein a capacitance at an output of the delay elements of the first delay ring is different from a capacitance at an output of the delay elements of the second delay ring.

19. The counter unit of claim 16, wherein the delay elements each comprise a transistor inverter circuit.

20. The counter unit of claim 19, wherein transistor dimensions of the delay elements of the first delay ring are different from transistor dimensions of the delay elements of the second delay ring.

21. The counter unit of claim 16, wherein the detection elements are configured to detect both a coincidence of positive and negative clock edges at the respective outputs.

22. The counter unit of claim 16, wherein the decoder unit is coupled to the plurality of detection elements via a plurality of pattern detectors.

23. The counter unit of claim 16, wherein the cycle counter comprises a comparison element configured to compare a first counter value corresponding to clock cycles of the first delay ring and a second counter value corresponding to clock cycles of the second delay ring and generate the cycle word based on the comparison result.

24. The counter unit of claim 16, wherein the cycle counter is coupled to a further pair of delay elements of the first and the second delay ring, and is configured to count clock cycles of the first and the second delay ring and determine a numerical range of the position word.

25. The counter unit of claim 16, further comprising a detection unit coupled to a first and a second pair of delay elements of the first and the second delay ring, and configured to evaluate a detection of a coincidence of clock edges at the respective pairs of delay elements and derive a numerical range of the position word.

26. The counter unit of claim 16, wherein the decoder unit is configured to convert a thermometer coded position information into the binary position word.

27. A phase locked loop, comprising:
a controlled oscillator comprising a control input and an oscillator output;
a loop filter comprising a filter input and a filter output coupled to the control input of the controlled oscillator; and
a detection arrangement comprising
a counter unit with an input coupled to the oscillator output configured to receive a first clock signal thereat, the counter unit configured to derive a first data word as a function of a time deviation between clock edges of the first clock signal and a reference clock signal, and
a signal processing unit coupled to the filter input configured to determine a phase deviation word as a function of the first data word and a second data word, the second data word depending on a duration of a clock period of the reference clock signal.

28. The phase locked loop of claim 27, wherein the input of the counter unit is coupled to the oscillator output via a frequency divider.

29. The phase locked loop of claim 27, wherein the controlled oscillator comprises a digitally controlled oscillator.

30. A detection method, comprising:
deriving a first data word, as a function of a time deviation between clock edges of a first clock signal and a reference clock signal, using a phase frequency detector; and
determining a phase deviation word as a function of the first data word and a second data word using the phase frequency detector, wherein the second data word based on a duration of a clock period of the reference clock signal.

31. The method of claim 30, wherein the second data word is derived as a function of clock edges of the reference clock signal.

32. The method of claim 31, wherein the first and the second data word are derived concurrently.

33. The method of claim 31, wherein the first and the second data word are derived sequentially.

34. The method of claim 30, wherein deriving the first data word comprises:
delaying a first signal derived from the first clock signal by a plurality of delay steps, each delay step comprising a first delay time;
delaying a second signal derived from the reference clock signal by a plurality of delay steps, each delay step comprising a second delay time that is different from the first delay time;
determining a number of delay steps corresponding to a coincidence of clock edges of the delayed first signal and the delayed second signal; and
generating the first data word as a function of the determined number.

35. The method of claim 34, wherein delaying the first and the second signal comprises inverting of the first and the second signal respectively.

36. The method of claim 34, wherein determining the number of delay steps comprises detecting positive and negative clock edges of the first and the second signal.

37. The method of claim 34, wherein delaying the first and the second signal is performed in a first and a second delay ring respectively, the first and the second delay ring comprising the same number of delay elements.

38. The method of claim 37, wherein the first data word is derived as a function of a position of the coincidence of clock edges, and of a number of clock cycles of the first and the second delay ring at the time of the coincidence.

39. The method of claim 37, wherein the first data word is derived by evaluating a detection of a coincidence of clock edges at a first and a second pair of delay elements of the first and the second delay ring and by deriving a numerical range of the position word.

40. The method of claim 30, wherein determining the phase deviation word comprises normalizing the first data word with respect to the second data word.

41. The method of claim 40, wherein determining the phase deviation word comprises at least one of the following: providing an offset value to the phase deviation word; clipping the phase deviation word depending on a clipping value; or scaling the phase deviation word by a scaling factor.

42. The method of claim 30, wherein deriving the first data word comprises generating a first and a second auxiliary clock signal, each comprising a first and a second clock edge, the first clock edge of the first auxiliary clock signal based on a first clock edge of the first clock signal, the first clock edge of the second auxiliary clock signal based on a first clock edge of the reference clock signal and the second clock edge of the first and the second auxiliary clock signal each based on a detection signal or on a second clock edge of the first clock signal.

43. The method of claim 31, wherein deriving the second data word comprises frequency dividing the reference clock signal.

44. A method for generating an oscillator signal with a controlled oscillator, comprising:
generating the oscillator signal as a function of a control signal;
deriving a first clock signal as a function of the oscillator signal;
deriving a first data word as a function of a time deviation between clock edges of the first clock signal and a reference clock signal;
determining a phase deviation word as a function of the first data word and a second data word, the second data word based on a duration of a clock period of the reference clock signal; and
adapting the control signal based on the phase deviation word.

45. The method of claim 44, wherein deriving the first clock signal comprises frequency dividing the oscillator signal.

46. The method of claim 44, wherein adapting the control signal comprises filtering the phase deviation word.

47. The method of claim 44, wherein the control signal comprises a digital control word.

* * * * *